(12) United States Patent
Furuyama

(10) Patent No.: US 10,541,234 B2
(45) Date of Patent: Jan. 21, 2020

(54) OPTICAL SEMICONDUCTOR MODULE AND METHOD OF MANUFACTURING THE SAME

(71) Applicant: KABUSHIKI KAISHA TOSHIBA, Minato-ku, Tokyo (JP)

(72) Inventor: Hideto Furuyama, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 221 days.

(21) Appl. No.: 15/457,092

(22) Filed: Mar. 13, 2017

(65) Prior Publication Data

US 2018/0082990 A1    Mar. 22, 2018

(30) Foreign Application Priority Data

Sep. 20, 2016 (JP) .................................. 2016-183391

(51) Int. Cl.
*H01L 31/12* (2006.01)
*G02B 6/42* (2006.01)
(Continued)

(52) U.S. Cl.
CPC .......... *H01L 25/167* (2013.01); *G02B 6/4214* (2013.01); *G02B 6/4245* (2013.01);
(Continued)

(58) Field of Classification Search
CPC ... H01L 25/167; H01L 31/0203; H01L 25/16; H01L 25/00; H01L 31/12; H01L 33/12;
(Continued)

(56) References Cited

U.S. PATENT DOCUMENTS 6,603,782 B2   8/2003  Nakanishi et al.
6,628,000 B1 * 9/2003  Pham ................... G02B 6/4224
                                                          257/432
(Continued)

FOREIGN PATENT DOCUMENTS

JP    2842388 B2    1/1999
JP    3817510 B2    9/2006
(Continued)

OTHER PUBLICATIONS

Machine translation of Fukasawa et al (JP2013-125867A) (Jun. 24, 2013) 20 pages.*

(Continued)

*Primary Examiner* — Caridad Everhart
(74) *Attorney, Agent, or Firm* — Foley & Lardner LLP

(57) ABSTRACT

According to one embodiment, an optical semiconductor module is disclosed. The module includes an optical semiconductor. An electrode lead is arranged apart from the optical semiconductor element. A resin holds the optical semiconductor element and the electrode lead. An interconnect layer electrically or functionally connects the optical semiconductor element and the electrode lead. The optical semiconductor element and the electrode lead are embedded in the same surface side of the resin. A part of the interconnect layer is directly provided on the resin or provided on the resin via an insulating layer.

18 Claims, 16 Drawing Sheets

(51) Int. Cl.
*H01L 31/0203* (2014.01)
*H01L 25/16* (2006.01)
*H01L 31/02* (2006.01)
*H01L 31/0232* (2014.01)
*H01L 31/024* (2014.01)

(52) U.S. Cl.
CPC ........ *G02B 6/4274* (2013.01); *H01L 31/0203* (2013.01); *H01L 31/024* (2013.01); *H01L 31/02005* (2013.01); *H01L 31/02327* (2013.01); *H01L 31/12* (2013.01)

(58) Field of Classification Search
CPC ..... H01L 2924/181; H01L 2924/12041; H01L 2224/73265; H01L 2224/94; H01L 33/62; H01L 2933/005; G02B 6/4214; G02B 6/4212; G02B 6/4274
See application file for complete search history.

(56) References Cited

U.S. PATENT DOCUMENTS

| | | | |
|---|---|---|---|
| 7,009,297 B1 * | 3/2006 | Chiang | ............... H01L 21/4832 257/738 |
| 7,151,865 B2 | 12/2006 | Ouchi | |
| 2005/0056773 A1 * | 3/2005 | Kaneko | ................. H01S 5/0264 250/214 R |
| 2013/0070452 A1 | 3/2013 | Urano et al. | |
| 2014/0301696 A1 | 10/2014 | Sasaki et al. | |

FOREIGN PATENT DOCUMENTS

| | | | | | |
|---|---|---|---|---|---|
| JP | 3831350 B2 | | 10/2006 | | |
| JP | 3921940 B2 | | 5/2007 | | |
| JP | 2009-229662 A | | 10/2009 | | |
| JP | 2010-097169 A | | 4/2010 | | |
| JP | 2011-249737 A | | 12/2011 | | |
| JP | 2013125867 A | * | 6/2013 | ... | H01L 2224/45144 |
| JP | 2014-203945 A | | 10/2014 | | |
| WO | WO-2013/077144 A1 | | 5/2013 | | |

OTHER PUBLICATIONS

Shinya Sasaki et al., "Development of Embedded Package with Optical Component," 21st Symposium on "Microjoining and Assembly Technology in Electronics," Feb. 3-4, 2015, pp. 345-348 and its English machine translation thereof.

* cited by examiner

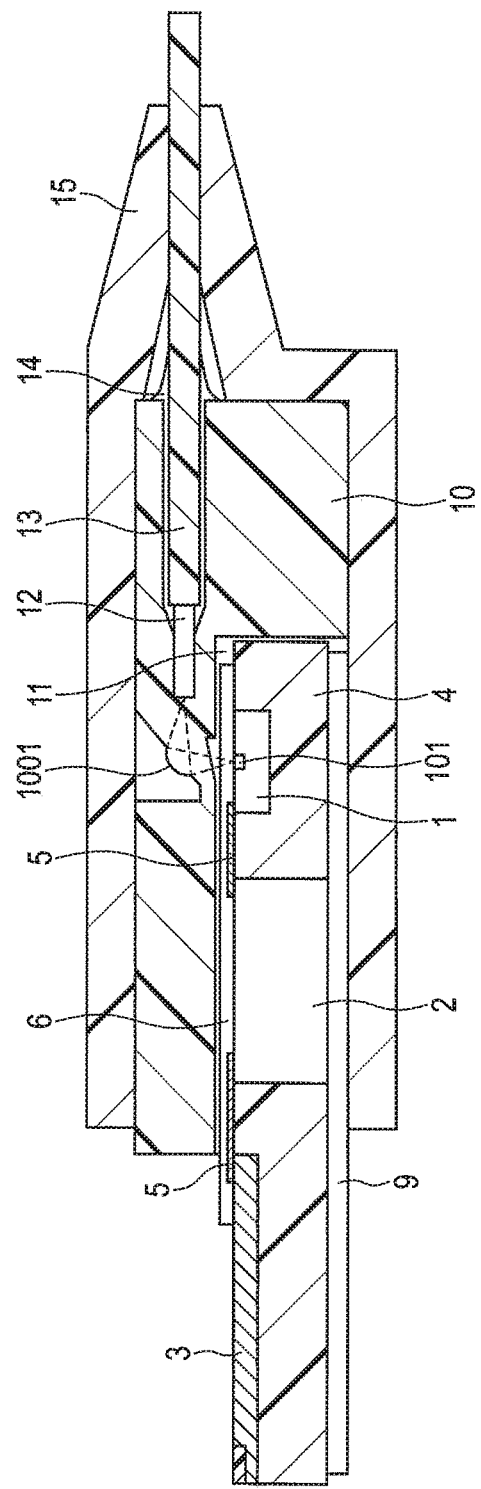
F I G. 9

Optical input/output

OPTICAL SEMICONDUCTOR MODULE AND METHOD OF MANUFACTURING THE SAME

CROSS-REFERENCE TO RELATED APPLICATIONS

This application is based upon and claims the benefit of priority from Japanese Patent Application No. 2016-183391, filed Sep. 20, 2016, the entire contents of which are incorporated herein by reference.

FIELD

Embodiments described herein relate generally to an optical semiconductor module and a method of manufacturing the same.

BACKGROUND

Recently, the technology for reducing costs of semiconductor modules has been developed. The semiconductor modules includes semiconductor devices. The semiconductor modules are applied, for example, in radio communication modules for mobile data devices or the Internet of Things (IOT), or optical link modules (optical semiconductor modules) for optical transmission in data centers.

BRIEF DESCRIPTION OF THE DRAWINGS

FIG. 9 is a schematic sectional view illustrating an example of an optical semiconductor module coupled to an optical fiber according to an embodiment.

DETAILED DESCRIPTION

Figure 1A:
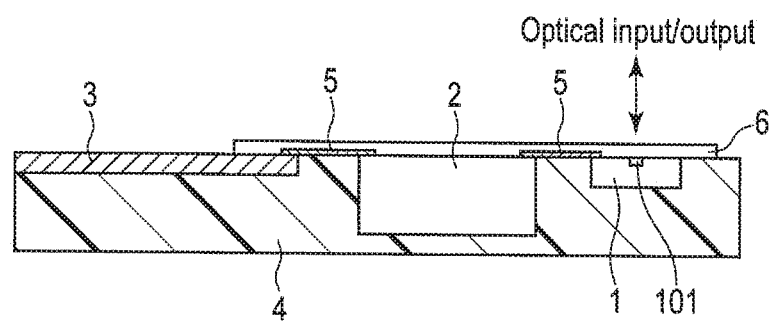
FIG. 1A is a schematic sectional view illustrating an optical semiconductor module according to an embodiment.

In general, according to one embodiment, an optical semiconductor module is disclosed. The module includes an optical semiconductor. An electrode lead is arranged apart from the optical semiconductor element. A resin holds the optical semiconductor element and the electrode lead. An interconnect layer electrically or functionally connects the optical semiconductor element and the electrode lead. The optical semiconductor element and the electrode lead are embedded in the same surface side of the resin. A part of the interconnect layer is directly provided on the resin or provided on the resin via an insulating layer.

According to one embodiment, an optical semiconductor module manufacturing method is disclosed. The method includes arranging a lead frame on an adhesive member, the lead frame comprising at least one conductive lead. At least one optical semiconductor element is arranged on the adhesive member by using the lead frame as a coordinate reference such that the at least one optical semiconductor element is not in contact with the lead frame. The lead frame and the at least one optical semiconductor element are integrated with a resin. The adhesive member is removed from the lead frame, the at least one optical semiconductor element and the resin. At least one interconnect layer is formed on a region exposed by removing the adhesive member such that the at least one interconnect layer electrically or functionally connects the at least one optical semiconductor element and the at least one conductive lead.

Embodiments will be described hereinafter with reference to the accompanying drawings. The drawings are schematic and conceptual, and the dimensions, the proportions, etc., of each of the drawings are not necessarily the same as those in reality. Further, in the drawings, the same reference symbols denote the same or corresponding portions, and overlapping explanations thereof will be made as necessary. In addition, as used in the description and the appended claims, what is expressed by a singular form shall include the meaning of "more than one."

The semiconductor modules are frequently used in the fields of communications and information processing such as radio communication modules or integrated components for mobile data devices or the IOT, or optical link modules for optical data transmissions in the data centers. Especially, the optical semiconductor module, which includes an optical semiconductor element, is used in an optical data transmission technology such as an optical communication or an optical interconnection, or an optical record technology such as an optical disk pickup, and further in a field such as an optical information processing technique or an optical measurement technology.

Hereafter, the embodiments are explained with respect to the optical semiconductor module for optical fiber data transmission. However, it should be understand that the following descriptions are not intended to limit the embodiments, to the contrary, it is intended that the embodiments covers the other applications of the optical semiconductor module or other types of semiconductor modules mentioned above.

A basic structure of the optical semiconductor module comprises a packaged optical semiconductor element such as a light emitting element or a light receiving element. Another basic structure of the optical semiconductor module comprises a drive IC in addition to the optical semiconductor element. Yet another basic structure of the optical semiconductor module comprises an integrated element in which the optical semiconductor element and the drive IC are integrated. Transmission media of light such as an optical fiber cable or an optical waveguide is appropriately selected in accordance with the application of the optical semiconductor module.

Among the optical semiconductor modules, an optical semiconductor module for optical data transmission of a large-scale equipment such as an optical communication for trunk line or an optical interconnection between large-scale information devices such as a processing unit of a supercomputer places great importance on performance and reliability. Consequently, the optical semiconductor module has a relatively low restriction as for members to be used or inspection cost, and it is not unusual that the final cost of the optical semiconductor module is several thousands times the material cost of the optical semiconductor element.

On the other hand, in consumer equipment and the like, data transmission of high-definition image through the optical interconnection without a data compression is in some cases better than the data transmission of high-definition image through the electrical interconnection with the data compression in terms of energy efficiency or performance. In addition, even in the board of industrial equipment, the number of suitable cases that use the optical interconnections has been increased than the number of suitable cases that uses the electrical interconnects. The reduction of cost is indispensable when the optical interconnection is applied in such equipment, and marginal coast is required to be reduced in a manner that material cost is to be predominant factor.

(First Embodiment)

Figure 1B:
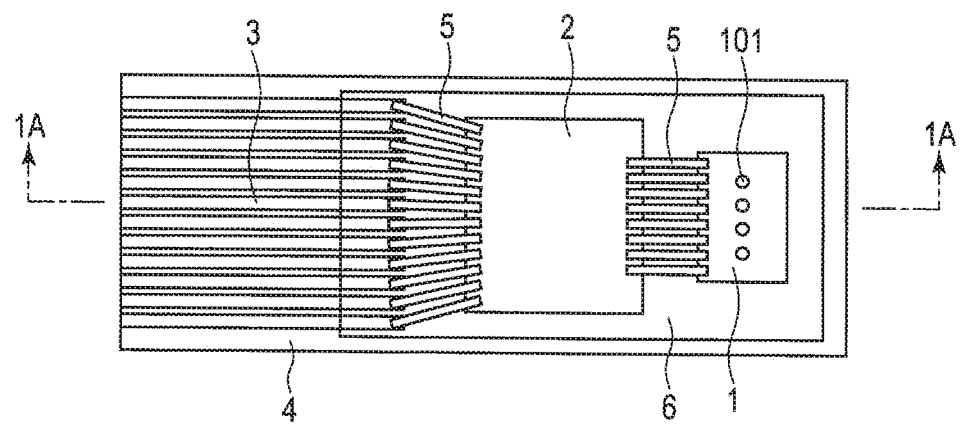
FIG. 1B is a schematic top view illustrating the optical semiconductor module according to the embodiment.
Figure 1C:
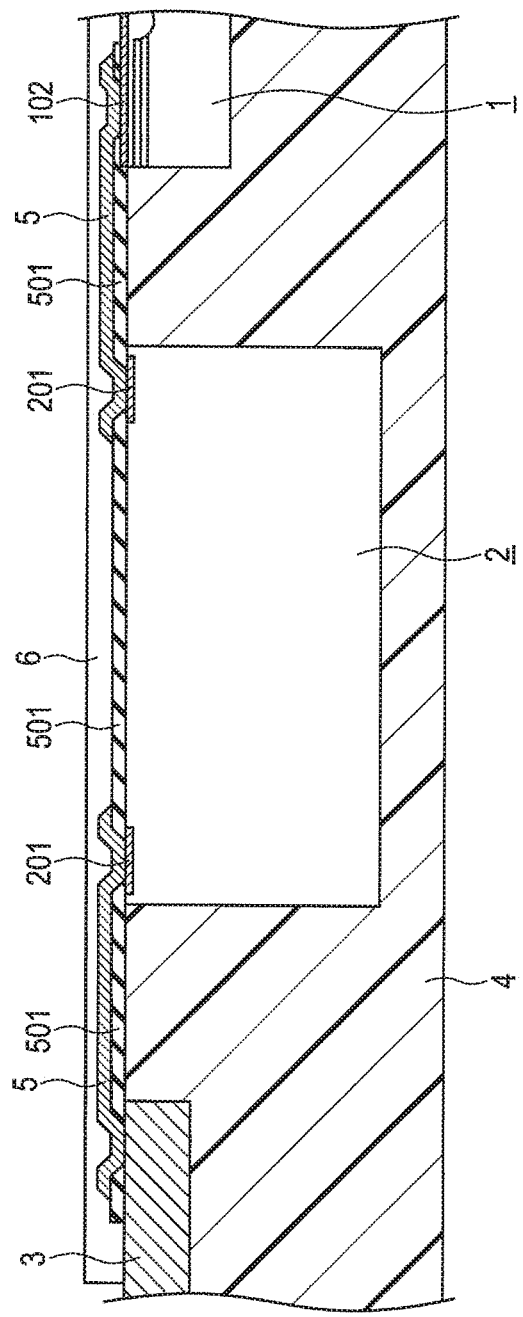
FIG. 1C is an enlarged schematic sectional view illustrating the optical semiconductor module according to the embodiment.
Figure 1D:
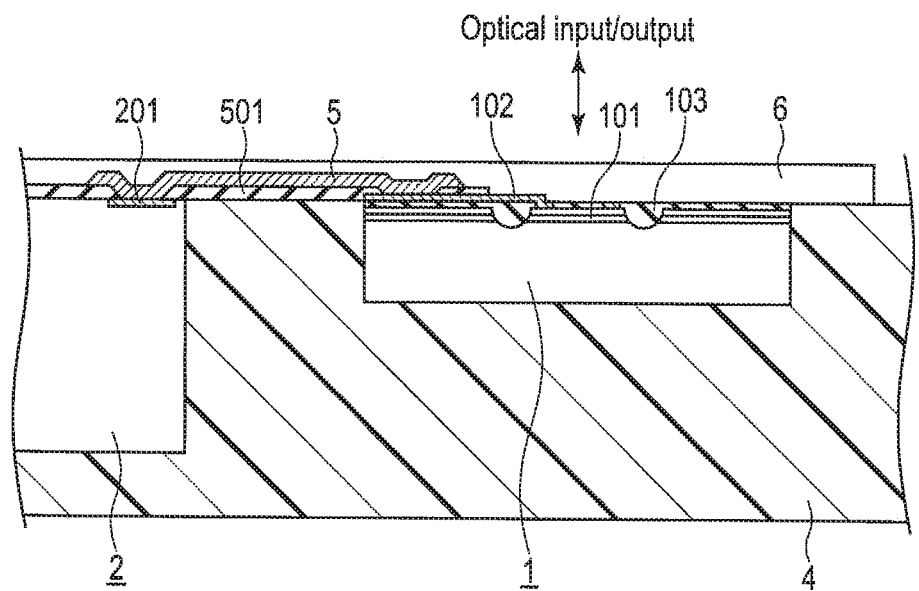
FIG. 1D is an enlarged schematic sectional view illustrating the optical semiconductor module according to the embodiment.

FIGS. 1A to 1E are schematic configuration diagrams illustrating an optical semiconductor module of the present embodiment, FIG. 1A is a sectional view, FIG. 1B is a top view, FIGS. 1C and 1D are enlarged sectional views. More particularly, FIGS. 1A and 1C are the sectional view taken along a line 1A-1A in FIG. 1B, and FIG. 1D is the sectional view taken along a line 1D-1D in FIG. 1E.

In FIGS. 1A to 1E, the reference symbol 1 denotes an optical semiconductor element, the reference symbol 101 denotes an active portion (light emitting portion and/or light receiving portion) of the optical semiconductor element 1, the reference symbol 102 denotes an on-chip interconnection electrode of the optical semiconductor element 1 (hereafter, referred to as "electrode"), the reference symbol 103 denotes an insulating film for the optical semiconductor element 1, the reference symbol 2 denotes a drive IC (optical transmitting IC or optical receiving IC) to drive the optical semiconductor element 1 (for optical transmitting and/or optical receiving), the reference symbol 201 denotes a terminal electrode of the drive IC 2 (hereafter, referred to as "electrode"), the reference symbol 3 denotes an electrode lead, the reference symbol 4 denotes a resin, the reference symbol 5 denotes a redistribution interconnect layer (for example, a metal interconnect layer; hereafter referred to as "interconnect layer"), the reference symbol 501 denotes a buffer insulating layer for the interconnect layer 5, the reference symbol 6 denotes a transparent resin. Double-headed arrows shown in FIGS. 1A and 1D denote positions and directions of light input and/or light output of the optical semiconductor element 1.

The optical semiconductor element 1 includes at least one of a light emitting element and a light receiving element. The light emitting element is, for example, a semiconductor laser or a light emitting diode. The light receiving element is, for example, a pin photodiode or an avalanche photodiode.

Figure 1E:
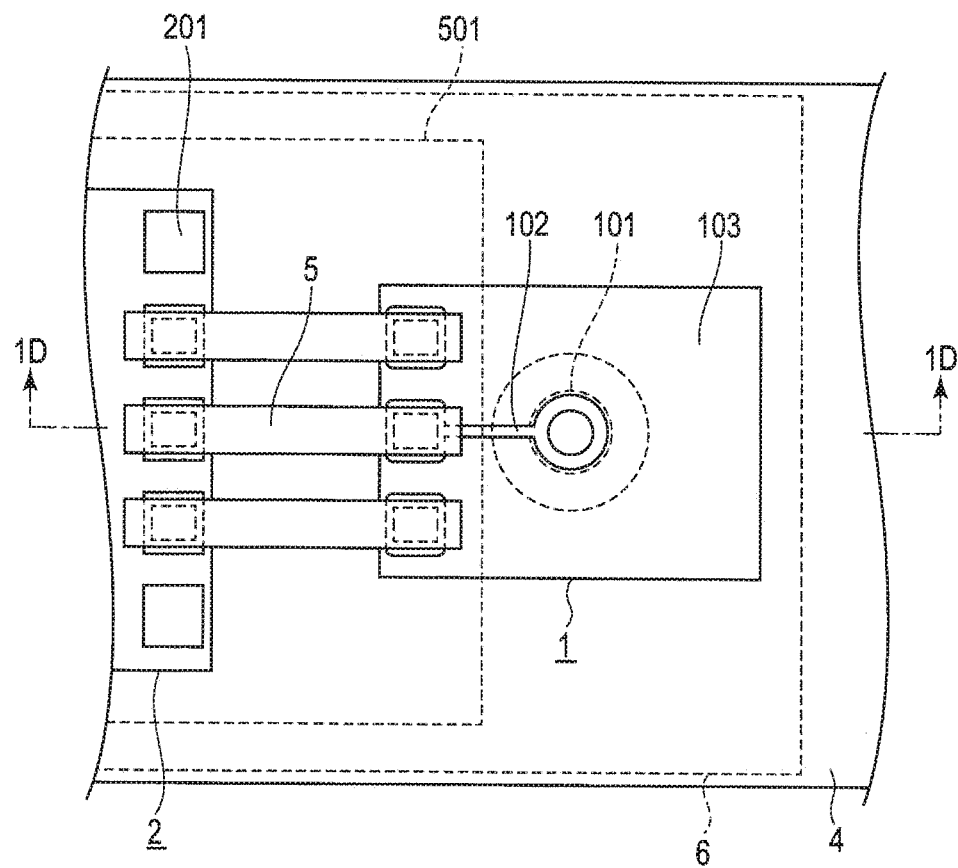
FIG. 1E is an enlarged schematic top view illustrating the optical semiconductor module according to the embodiment.

In FIG. 1E, the optical semiconductor element 1 is illustrated as a single element for simplicity, but the optical semiconductor element 1 may be an array comprising a plurality of elements (a plurality of light emitting portions and/or light receiving portions) as shown in FIG. 1B. Moreover the optical semiconductor element 1 may be a composite element including at least one of the light emitting elements and the light receiving elements.

The electrode of the optical semiconductor element 1 is electrically connected to the active portion 101. The electrode 102 includes a portion arranged on the insulating film 103, and an end of the portion constitutes a electrode pad for an external connection. In addition, an electrode other than the electrode 102 such as an earth electrode is also configured similarly to the electrode 102.

The drive IC 2 electrically drives the optical semiconductor element 1 for transmitting an electric signal to an external or receiving an electric signal from the external. When the drive IC 2 is a driver IC for light emitting, the light emitting element such as a semiconductor laser or a light emitting diode is used as the optical semiconductor element 1, and a bias current superimposed a modulation current is applied to the light emitting element. The modulation current corresponds to an input signal of the drive IC 2. As a method for transmitting light, it is also known a light modulation method that modulates light coming from other light emitting element or light coming from an external. In this method, a semiconductor optical modulator is used as the optical semiconductor element, or an optical modulator of ceramic or organic material with an optical semiconductor light source element is used instead of the optical semiconductor element. A bias voltage superimposed a modulation voltage corresponding to an input signal are applied to the optical modulator. When the drive IC 2 is a receiver IC for light receiving, the light receiving element such as a pin photodiode or an avalanche photodiode is used as the optical semiconductor element 1. A bias voltage is applied to the light receiving element, and the light receiving element generates a current corresponding to an input light, and the drive IC 2 outputs a signal corresponding to the generated current.

The optical semiconductor element 1 and the drive IC 2 may be integrated into a single element (not shown) when the optical semiconductor element 1 is a silicon-based photodiode or the like.

The optical semiconductor element 1 and the drive IC 2 may be a chip (not shown) in which the optical semiconductor element 1 is bonded on the drive IC 2 (stacked integrated chip). In this case, the optical semiconductor element 1, which is to be bonded on the drive IC 2, is preferably as thin as possible. A preferable method of forming the thin optical semiconductor element 1 includes, for example, epitaxially growing an active crystal layer on a crystal growth substrate, and removing the crystal growth substrate from the active crystal layer or thinning the crystal growth substrate.

In the stacked integrated chip, the optical semiconductor element 1 sticks out from the surface of the drive IC 2, so that the optical semiconductor element 1 may be declined. In order to suppress the declining of the optical semiconductor element 1, it is preferable to employ a support member (e.g., a pad of polyimid resin). The support member has a thickness corresponding to a thickness of the optical semiconductor element 1. The support member is provided on an area of the surface of the drive IC 2, which is not covered with the optical semiconductor element 1.

The optical semiconductor element 1 and the drive IC 2 may be electrically connected by solder bump when the optical semiconductor element 1 is stacked on the drive IC 2 to form the stacked integrated chip. Alternatively, the optical semiconductor element 1 and the drive IC 2 may be electrically connected by the interconnect layer 5 after the optical semiconductor element 1 is stacked on the drive IC 2 to form the stacked integrated chip.

The electrode lead 3 is a part of a lead frame to which a plurality of optical semiconductor modules are connected as described later. The electrode lead 3 is a metallic fragment which is cut off from the lead frame when dividing the plurality of optical semiconductor modules connected to the lead frame into individual pieces. The electrode 3 is, for example, a Cu lead which has 150 µm thickness, 200 µm width and 400 µm arrangement pitch (200 µm terminal interval in this case). At least a part of the electrode lead 3, which is exposed from a resin as described later, is plated with Au/Ni for instance. The lead frame is obtained by etching a thin metal plate comprises Cu, 42 alloy or the like. The etching is performed such that the thin metal plate is patterned into electrode leads having a predetermined shape, and a frame holding the electrode leads. When a tape-like metal is used as the thin metal plate, the lead frame can be formed at very low cost because the tape-like metal can be continuously processed by roll-to-roll etching.

The resin 4 holds the optical semiconductor element 1, the drive IC 2 and the electrode lead 3 which are arranged such that optical semiconductor element 1, the drive IC 2 and the electrode lead 3 are apart from each other. The optical semiconductor element 1, the drive IC 2 and the electrode lead 3 are configured to be embedded in the same side of the resin 4. That is, at this stage, the optical semiconductor element 1, the drive IC 2 and the electrode lead 3 are exposed from at least on the same side of the resin 4. The resin 4 is, for example, epoxy resin, silicone resin or the like in which silica filler is mixed to match a coefficient of thermal expansion of the resin 4 to a coefficient of thermal expansion of semiconductor material. In a manufacturing method described later, it is preferable to use a resin for wafer level package which can suppress a wafer warpage by controlling a coefficient of elasticity of the resin.

A part of the interconnect layer 5 is directly provided on the resin 4 or provide on the resin 4 through a buffer insulating layer 501 to be described later. The interconnect layer 5 is, for example, a pattern interconnect which has 5 µm thickness and is formed by Cu plating. The buffer insulating layer 501 is formed on a region including electrode pads of the optical semiconductor element 1 and the drive IC 2, and an edge portion of the electrode lead 3. The buffer insulating layer 501 includes, for example, a relatively elastic organic film whose material contains a heat resistant resin such as polyimide. The thickness of the buffer insulating layer 501 is, for example, 5 µm.

A plurality of openings are provided in the buffer insulating layer 501. The plurality of openings are placed on the pad electrode portions of the optical semiconductor element 1 and the drive IC 2. Another plurality of openings may be provided in the buffer insulating layer 501, which are placed at the edge portion of the electrode lead 3.

As shown in FIGS. 1C, 1D and 1E, the interconnect layers 5 are provided on the buffer insulating layer 501 and in the openings of the buffer insulating layer 501, thereby electrically connecting the optical semiconductor element 1, the drive IC 2 and the electrode lead 3 by the interconnect layer 5.

In the present embodiment, the interconnect layers 5 includes two independent interconnects, one connects an electrode of the optical semiconductor element 1 and an optical element connection electrode of the drive IC 2, and the other connects an external connection electrode (input terminal of signal or output terminal of signal) of the drive IC 2 and an electrical connection portion of the electrode lead 3. The interconnect layer 5 may further includes an interconnect which directly connects the optical semiconductor element 1 and the electrode lead 3. The buffer insulating layer 501 prevents breaking of the interconnect layer 5 caused by thermal strain at an interface between the resin 4 and the embedded element (optical semiconductor element 1, drive IC 2 or electrode lead 3), or delamination at the interface due to mechanical stress, etc. However, the buffer insulating layer 501 may be omitted when the strain and the stress are sufficiently suppressed.

The transparent resin 6 protects the interconnect layer 5 against corrosion, and prevents the optical semiconductor element 1, the drive IC 2, etc. from being broken due to mechanical contact. In order for the optical semiconductor element 1 to emit or receive light, the transparent resin 6 includes resin having a transparency at operating wavelength of the optical semiconductor element 1. The transparent resin 6 may includes, for example, polyimid resin, epoxy resin, silicone resin, acrylate resin, polycarbonate resin, polyvinylidene chloride resin, fluorine resin or the like. More particularly, the transparent resin 6 includes epoxy resin containing fine silica of about 100 nm diameter for instance, and has 30 µm thickness for instance, which is provided to expose a part of the electrode lead 3 as shown in FIG. 1A. In addition, an inorganic film coat (not shown) such as $SiO_2$ or $SiN_x$ may be provided on the transparent resin 6, which is used as a protective cover for improving humidity resistance. Moreover, instead of the transparent resin 6, a glass plate may be bonded using transparent adhesive. Further more, an antireflection coating (not shown) may be applied on them.

With such a configuration, a mounting substrate or an interconnect substrate is not required, and a part of the module (electrode lead 3) functions as a terminal of an electrical connector (for example, connector plug), which results in obtaining the optical semiconductor module capable of simplifying an external electrical connector, too.

Thereby not only reducing cost of the module which is as a result of the minimization of necessary members of the module, but also eliminating the need of electrical connector assembly for module mounting, and the module mounting is finished only by putting the module terminal into an electrical connector (for example, connector jack) of a printed wiring board. That is, the optical semiconductor module of the present embodiment enables reduction of the module members and the mounting members, which results in contribution to cost reduction of the optical transmission.

According to the configuration of the embodiment shown in FIGS. 1A to 1E, even the stress is generated in the connector terminal by the insertion and extraction of the electrical connector or by the tension of a cable, the stress is hard to occurred in the drive IC 2 or the optical semiconductor element 1. Because the influence of the stress generated in the connector terminal is reduced by the resin 4 and the interconnect layer 5. Although optical semiconductor module of the present embodiment includes the electrical connector, the semiconductor element in the optical semiconductor module is hard to be degraded. Thereby providing another effect that the module of the embodiment possesses high reliability.

When the drive IC 2 or the optical semiconductor element 1 is connected to the electrode lead 3 by bonding wire, a loop space for the bonding wire is required, so that the drive IC 2 or the optical semiconductor element 1 is keep away from the optical transmission medium (optical fiber, etc), for example, at a distance of a few hundred µm. In contrast, in the configuration of the present embodiment, the optical coupling is achieved at a distance corresponding to about the thickness of the transparent resin 6 (for example, 30 µm). Consequently, in the present embodiment, an optical fiber coupling can be achieved by directly butting the tip of a light connector (optical fiber) to the optical semiconductor module. Moreover, when the optical coupling is conducted by using a lens as described later, the optical coupling can be finished by only directly butting the optical input and/or output portion of the optical semiconductor module to a flat plane which is provided to a fiber holding member integrated with a lens. In the present embodiment, the optical coupling is achieved by the butting that is very simple and low-cost, thus the optical coupling portion is also realized by a very simple structure, and an assembling cost of the optical coupling portion is easily reduced.

As mentioned above, the optical semiconductor module of the present embodiment enables the cost reduction in the three aspects that are the module members, the mounting members and the assembling, thereby reducing cost of the optical transmission, and in addition the optical semiconductor module of the present embodiment is highly resistant to the mechanical external stress and the like.

(Second Embodiment)

FIGS. 2A and 2B to FIGS. 6A and 6B are schematic diagrams illustrating an optical semiconductor module of the present embodiment, FIGS. 2A to 6A are sectional view, FIGS. 2B to 6B are top views. More particularly, FIGS. 2A to 6A are respectively the sectional view taken along a line 2A-2A in FIG. 2B to line 6A-6A in FIG. 6B.

Figure 2A:
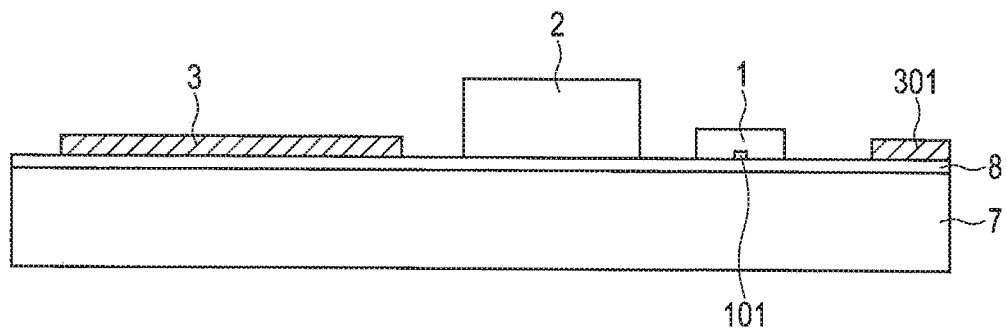
FIG. 2A is a schematic sectional view illustrating a manufacturing process of the optical semiconductor module according to an embodiment.
Figure 2B:
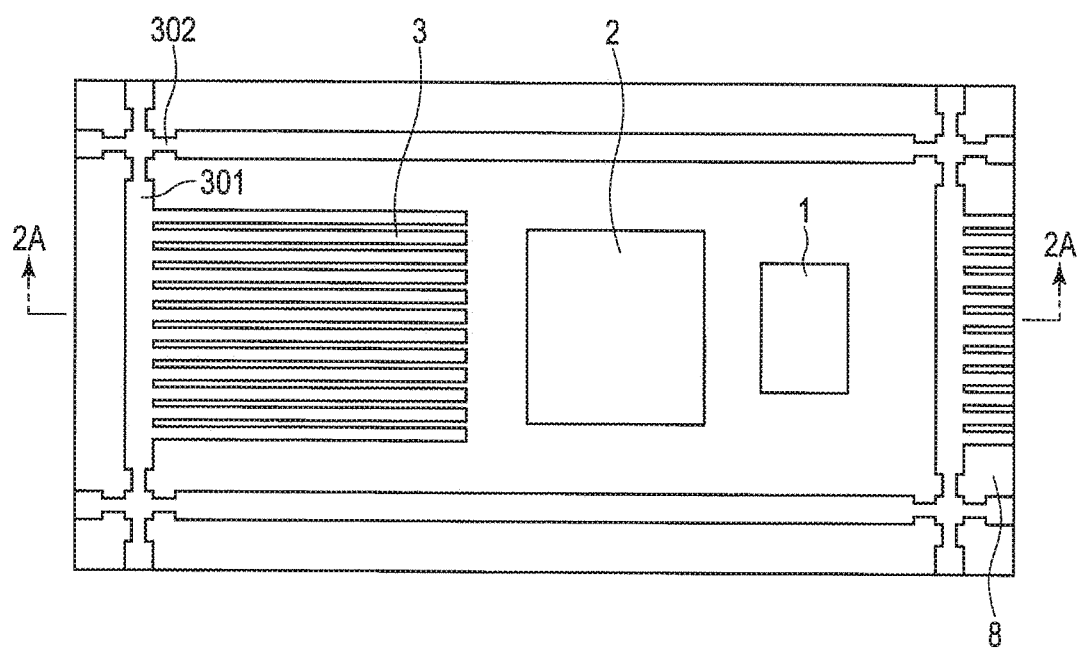
FIG. 2B is a schematic top view illustrating a manufacturing process of the optical semiconductor module according to the embodiment.

FIGS. 2A and 2B illustrate a state where a lead frame 301 for a plurality of the modules is provided on a surface of a temporary fixing layer (adhesive layer) 8 on a temporary substrate 7, and the optical semiconductor element 1 and the drive IC 2 are arranged at the predetermined position on the surface of the temporary fixing layer 8. Note that, in FIGS. 2A and 2B to FIGS. 6A and 6B, only one module (semiconductor element 1, drive IC 2, electrode lead 3, resin 4, interconnect layer 5) is shown for simplicity.

The optical semiconductor element 1 and the drive IC 2 are arranged not to be in contact with the lead frame 301. The alignment of the optical semiconductor element 1 and the drive IC 2 on the temporary fixing layer 8 is performed by using the lead frame 301 as a coordinate reference. The optical semiconductor element 1 and the drive IC 2 are arranged to face the surface of the temporary fixing layer 8. That is, the components shown in FIG. 2B are repeatedly arrange on the entire surface of the temporary fixing layer 8, which results in forming a plurality of the optical semiconductor module at a time. Hereafter, the temporary substrate 7 and the temporary fixing layer 8 are collectively called a temporary fix substrate.

When the temporary substrate 7 is a transparent substrate such as a glass substrate, the temporary fixing layer 8 may be an adhesive resin which can be cured and peeled off by ultraviolet irradiation treatment (ultraviolet irradiation curing and peeling type adhesive resin), and when the temporary substrate 7 is an opaque substrate such as silicon substrate, the temporary fixing layer 8 may be a adhesive resin which can generate foam and be peeled off by heating (thermal foaming and releasing type adhesive resin).

The temporary fix substrate may be formed by, for example, applying an adhesive resin tape as the temporary fixing layer 8 onto the temporary substrate 7, or coating the temporary substrate 7 with adhesive resin as the temporary fixing layer 8. Regardless of the method of forming the temporary fix substrate, the temporary fixing layer 8 is required to have adhesiveness in an initial state and the adhesiveness is reduced by ultraviolet irradiation treatment or heating treatment. The temporary substrate may be a mold tape which has a heat resistance against the resin mold temperature. In this case, thermal relaxation of a base material of the mold tape may cause a deformation of the mold tape, so that the design is required to allow a certain amount of chip misalignment.

Lead frame 301 is formed by, for example, subjecting a Cu plate (for example, 150 µm thickness) to photolithography process and etching process. The lead frame 301 includes support frames. The electrode leads of all of the modules can be processed at a time since the support frames support the electrode leads of the plurality of modules. The material of the lead frame 301 is, for example, anoxic Cu, Cu alloy (CuAg, CuZn, CuSnP, CuFeP, etc.), or Fe alloy (FeNi, etc.). An organic film coat or a plating treatment (Sn, Ni, Au/Ni or the like) is applied on the surface of the lead frame 301 in order to protect the lead frame 301 against corrosion. The surface of the lead frame 301 is cover with, for example, Sn, Ni or Au/Ni by the plating treatment.

The electrode lead 3 of optical semiconductor module in the final form preferably includes a lead frame 301 which has no exposed base metal surface. In order to achieve this, the entire exposed base metal surface of the lead frame 301 is plated, then the lead frame 301 is cut, and the exposed base metal surface of the electrode lead 3 appeared by cutting the lead frame 301 is plated (a first method). Alternatively, a plating treatment may be performed to an exposed base metal surface of the electrode lead 3 at a final stage in which resin molding and terminal shaping are finished (a second method).

The first method requires the additional plating treatment after cutting the electrode lead 3, however above-mentioned the exposed base metal portion is strongly plated by an electroplating only by the lead frame. The additional plating treatment may be performed by an electroless plating in a relatively short time. The second method may involve a problem that the electroplating is performed with a degradation risk of the semiconductor element in the module, or a problem that the electroless plating is performed for longer time, or a problem that the electroless plating results in decreasing of plating strength, however the plating treatment is completed by one-time plating. The selection which plating treatment should be used is determined by considering final yield and process cost. In the present embodiment, the first method is used, which enables the stronger plating treatment.

As described later with referring to FIGS. 6A and 6B, the process cost is efficiently reduced by narrowing the final lead frame cut portion 302 (second region) shown in FIG. 2B. Because narrowing the final lead frame cut portion 302 conduces to easy alignment of cut positions for dividing modules and easy simultaneously cutting of the resin 4 and the lead frame 301 (electrode lead 3).

Figure 3A:
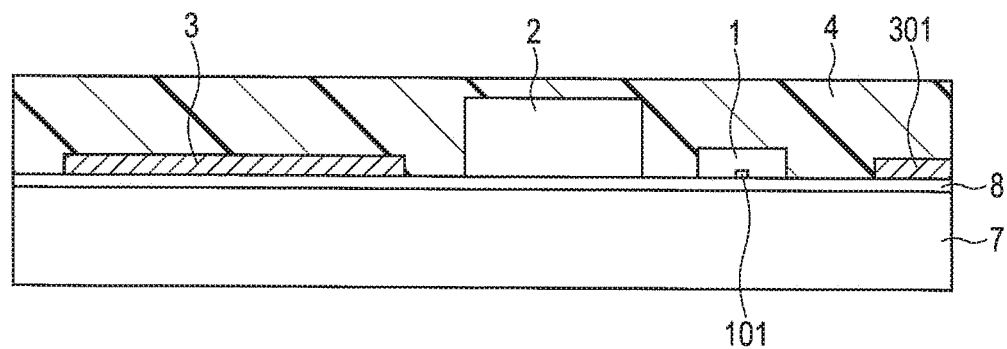
FIG. 3A is a schematic sectional view illustrating a manufacturing process of the optical semiconductor module according to the embodiment.
Figure 3B:
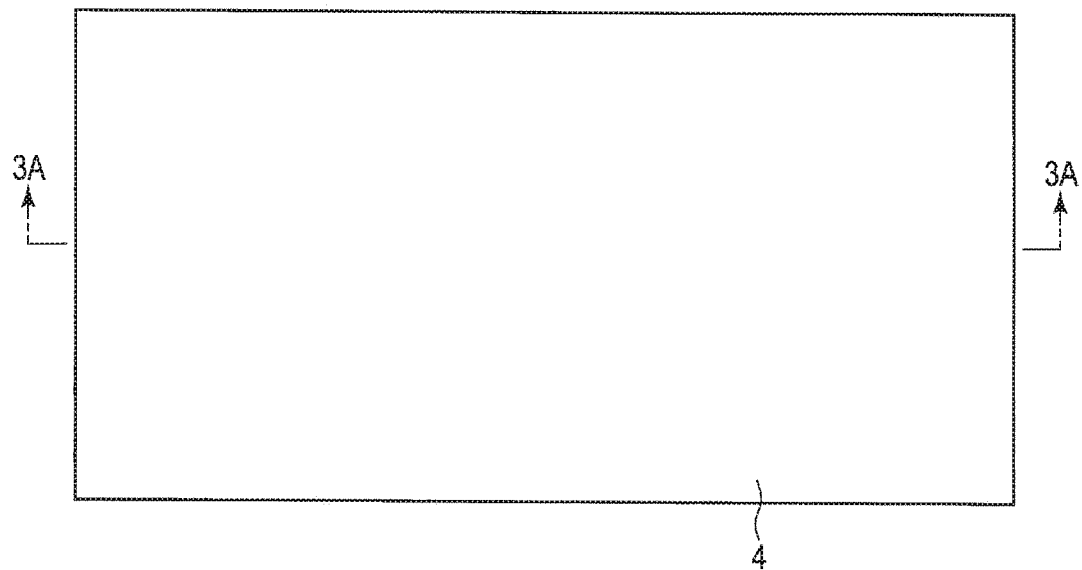
FIG. 3B is a schematic top view illustrating a manufacturing process of the optical semiconductor module according to the embodiment.

FIGS. 3A and 3B illustrate a state where the optical semiconductor element 1, the drive IC 2 and the lead frame 301 (electrode lead 3) are resin-molded, which are arranged as shown in FIGS. 2A and 2B. The resin-molding is performed to the entire surface of the temporary fixing substrate on the side of the temporary fixing layer 8. The temporary substrate 7 is, for example, a silicon substrate. The temporary fixing layer 8 is, for example, a double sided adhesive tape. The double sided adhesive tape comprises, for example, a base tape, a thermal foaming and releasing type adhesive resin on a surface of the base tape, and a mechanically removable adhesive resin on a rear surface of the base tape. The thermal foaming and releasing type adhesive resin is provided on the temporary substrate 7, and generates foam at 170° C. for instance. The mechanically removable adhesive resin is provided on the resin-molded side. The resin 4 includes, for example, epoxy resin and silica filler therein. That is, the resin 4 includes, for example, resin and other material (filler) which are adjusted for wafer level packaging of silicon devices.

After the resin-molding, the temporary fixing substrate 7 is removed from the temporary fixing layer 8 by performing adhesive force reduction treatment of the temporary fixing layer 8 (ultraviolet irradiation treatment, heating treatment or the like). In the above case, the resin mold temperature is set at, for example, 150° C., and then the resin is cured at 170° C. Thereby causing thermal foam expansion in the thermal foaming and releasing type adhesive resin, which enables the temporary substrate 7 to be released (separated) from the temporary fixing layer 8. Following that, the temporary fixing layer 8 (double sided adhesive tape) is mechanically released (separated) from the resin 4, thereby exposing a surface of the resin 4 which was covered by temporary fixing layer 8 (resin-molded side surface), and surfaces of the devices (optical semiconductor element 1, drive IC 2, lead frame 301) which was covered by temporary fixing layer 8. As a result, the structure that the optical semiconductor element 1, the drive IC 2 and the electrode lead 3 are embedded in the same side of the resin 4 is obtained. That is, at this stage, the optical semiconductor element 1, the drive IC 2 and the electrode lead 3 are exposed from the resin 4 on at least the same side of the resin 4.

Note that, in stead of the silicon substrate (max 12 inches diameter at present), an organic substrate for printed circuit board (for example, 400 mm □) or a large glass substrate (for example, 1 m×1.2 m) for forming a liquid crystal display may be used. By using such an organic substrate or a large glass substrate, the number of modules formed at a time increases, thus enabling reduction of process cost and material cost. In this case, needless to say, a coefficient of thermal expansion of the resin 4 is adjusted to the substrate material and the substrate size.

In order to achieve further reduction of the cost, a mold tape (one-sided adhesive tape) with thick base tape (for example, 200 μm thickness) having the heat resistance against the resin mold temperature may be used as the temporary fixing substrate and the temporary fixing layer. In this case, base tape of the mold tape corresponds to the temporary substrate 7, and an adhesive layer of the mold tape corresponds to the temporary fixing layer 8. The optical semiconductor element 1 and the drive IC 2 are mounted on the mold tape and resin-molded with attention that the mold tape is uniformly adhered to the lead frame 301, and then the mold tape is mechanically separated from the optical semiconductor element 1 and the drive IC 2, thereby enabling the similar process as the above process. This eliminates the need of the temporary fixing substrate 7, thus the cost can be further reduced. However, a placement accuracy of the semiconductor element may be decreased in a case of the mold tape only. Consequently, the design is required to consider the decrease of placement accuracy of the semiconductor element.

Figure 4A:
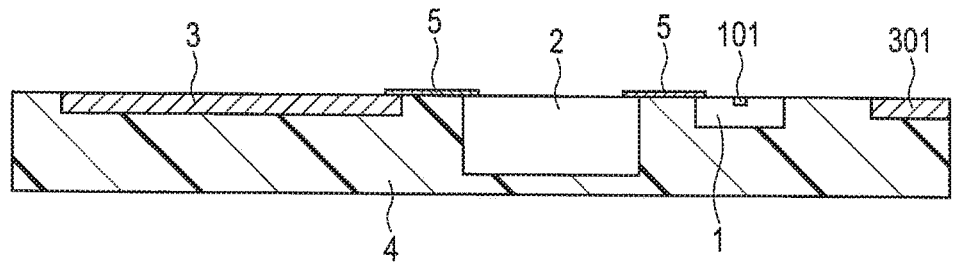
FIG. 4A is a schematic sectional view illustrating a manufacturing process of the optical semiconductor module according to the embodiment.
Figure 4B:
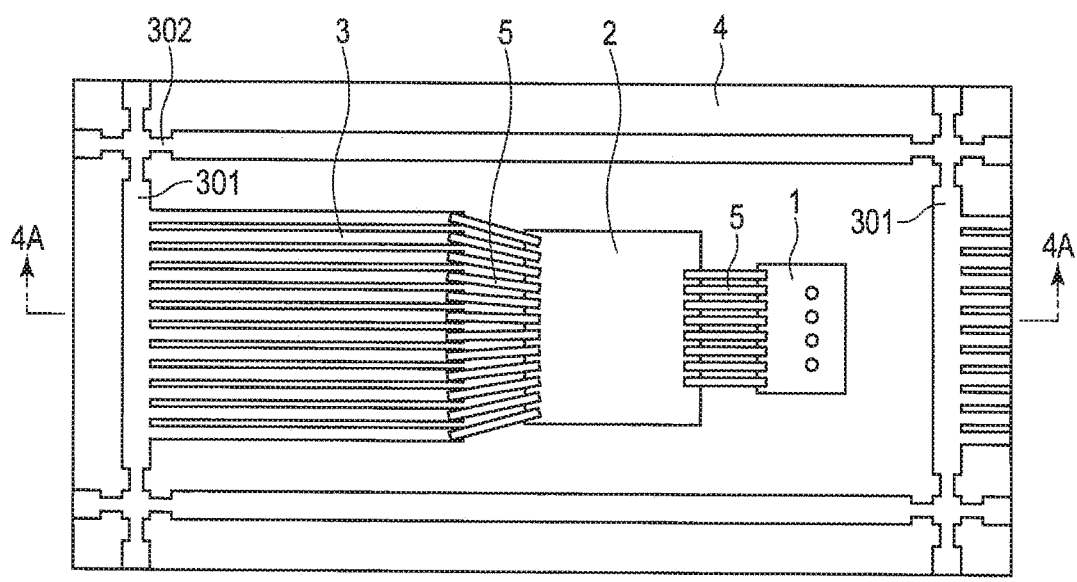
FIG. 4B is a schematic top view illustrating a manufacturing process of the optical semiconductor module according to the embodiment.
Figure 10:
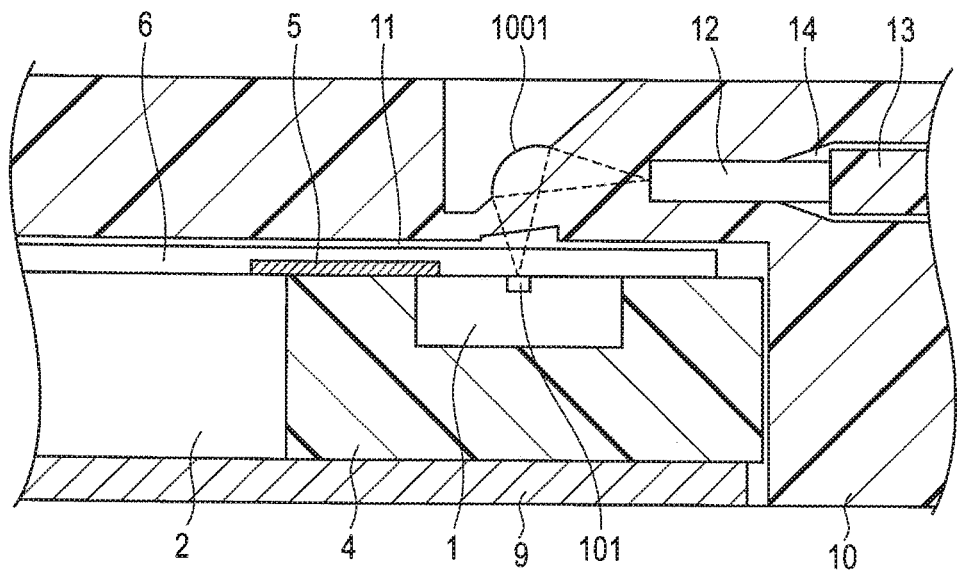
FIG. 10 is an enlarged schematic sectional view illustrating an optical system of the optical semiconductor module according to the embodiment.

FIGS. 4A and 4B illustrate a state where the interconnect layer 5 is formed on a unit including the optical semiconductor element 1, the drive IC 2 and lead frame 301 which are integrated by the resin molding. In FIGS. 4A and 4B, only one unit is depicted for simplicity, but actually a plurality of units exist. The interconnect layer 5 is formed on each of the units, which is performed collectively by entire wafer process. It is noted that one unit and one interconnect layer 5 are shown in FIGS. 4A and 4B for simplicity. When the process shown in FIGS. 3A and 3B is finished, the surface as the wafer shown in FIG. 3A turn upside down, and the structure shown in FIG. 3A is turned to a structure in which the surfaces of the elements in contact with the temporary fixing layer 8 are exposed, and the elements are embedded in the mold resin. The buffer insulating layer 501 shown in FIG. 10 is formed on this structure. That is, the buffer insulating layer is formed on a region including the region on which the interconnect layer 5 is to be formed. The buffer insulating layer 501 is preferably not provided on the optical input and/or output portion and opening on the pad electrode of the optical semiconductor element 1 and the drive IC 1 and the electrode lead 3 so that the buffer insulating layer may be formed of arbitrary material (such as non-transparent material). The buffer insulating layer suppresses the interconnect layer 5 from braking due to an unevenness or an interfacial crack which is easily generated at an interface between the resin and the element such as the optical semiconductor element 1, the drive IC 1 or the electrode lead 3. The buffer insulating layer preferably contains a material having relatively high heat resistance or high strength. As the material of the buffer insulating layer, for example, polyimide, Benzocyclobutene (BCB) or the like may be used.

Next, for example, a Cu plate interconnect having 5 μm thickness and a desired pattern is formed as the interconnect layer 5. The process of forming the Cu plate interconnect includes, for example, forming a Cu/Ti seed layer on the entire surface by sputtering, forming a resist pattern having a reverse pattern of the desired pattern, performing selective Cu plating by using the resist pattern as a mask, etching away the Cu/Ti seed layer between the Cu plates. The interconnect layer 5 includes an electric circuit pattern which reaches from the optical semiconductor element 1 to the lead frame 301 for instance. Alternatively, the Cu plate interconnect may be formed by forming a Cu layer on the entire surface of the seed layer by Cu plating, forming a resist pattern corresponding to the interconnect layer 5 on the Cu layer by photolithography, and etching the Cu layer and the seed layer by using the resist pattern as a mask.

Figure 5A:
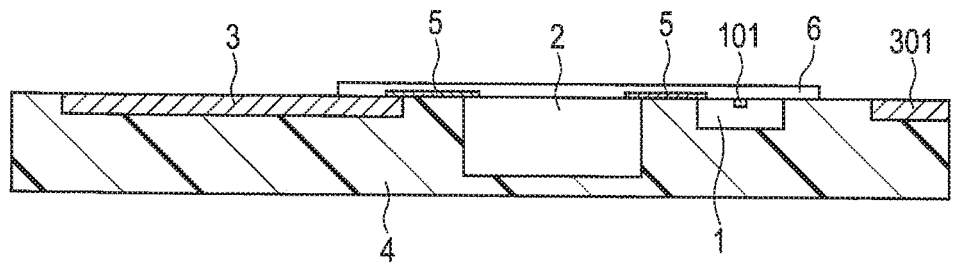
FIG. 5A is a schematic sectional view illustrating a manufacturing process of the optical semiconductor module according to the embodiment.
Figure 5B:
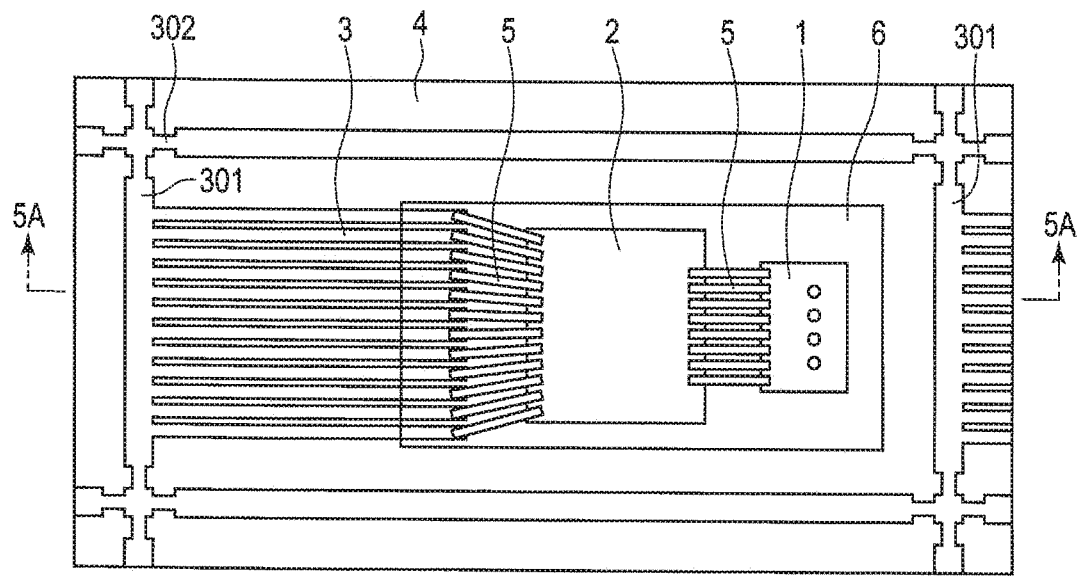
FIG. 5B is a schematic top view illustrating a manufacturing process of the optical semiconductor module according to the embodiment.

FIGS. 5A and 5B illustrate a state where the transparent resin 6 is provided, which protects the interconnect layer 5, the optical semiconductor element 1 and the drive IC 2. The transparent resin 6 has a function of suppressing corrosion of the interconnect layer 5, or suppressing broken of the optical semiconductor element 1 and the drive IC 2 due to mechanical contact. The transparent resin 6 is formed of transparent epoxy resin and fine silica therein. The thickness of the transparent epoxy resin is, for example, 30 μm. The diameter of the fine silica is, for example, about 100 nm. The interconnect layer 5 can be improved in respect to moisture resistance by providing a transparent inorganic film such as a $SiO_2$ film or a $SiN_x$ film on a surface of the interconnect layer 5 or on a surface of the transparent resin 6.

Figure 6A:
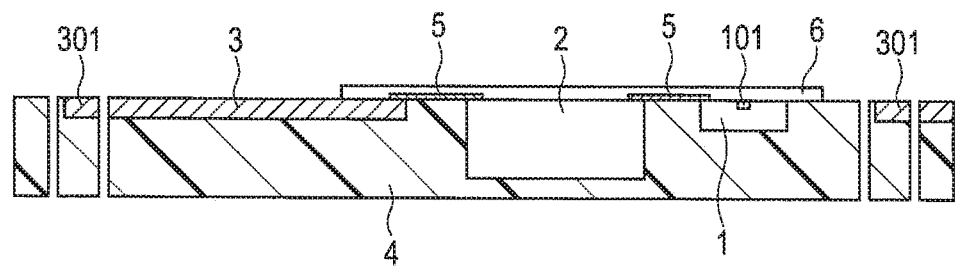
FIG. 6A is a schematic sectional view illustrating a manufacturing process of the optical semiconductor module according to the embodiment.
Figure 6B:
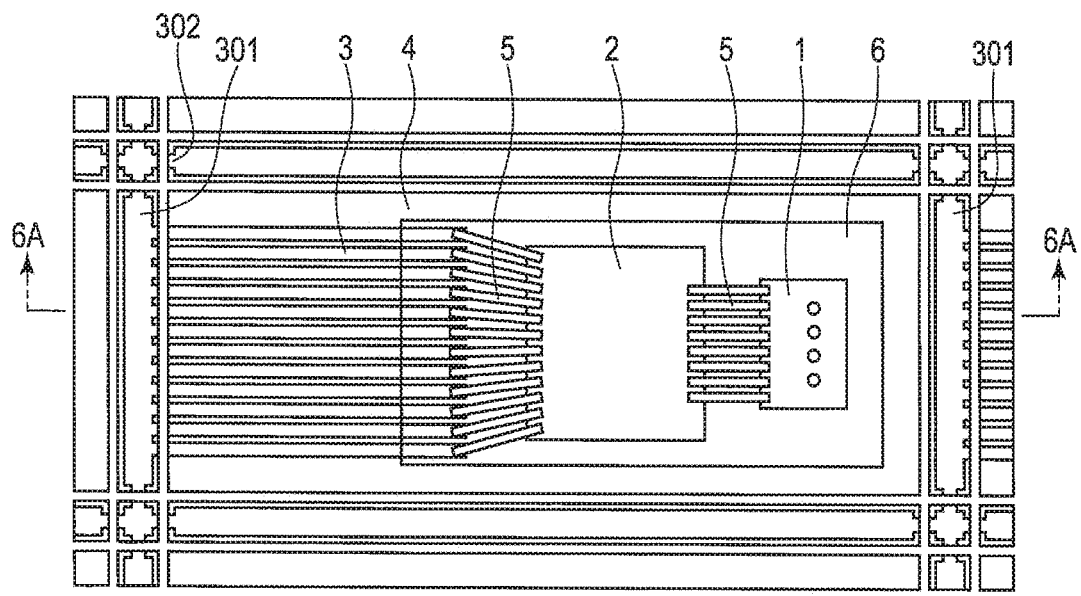
FIG. 6B is a schematic top view illustrating a manufacturing process of the optical semiconductor module according to the embodiment.

FIGS. 6A and 6B illustrate a state where the optical semiconductor modules are divided into individual pieces, more particularly resin 4 is cut by dicing with a diamond blade or by laser, and at the same time the electrode lead 3 is separated from the lead frame 3 by the dicing or the laser.

Here, the cutting of an outer frame portion of the lead frame 301 is not performed by at a time, but it is performed by two times of cuttings of the outer frame portion. In general, the semiconductor elements are divided into individual pieces by dicing. The condition for dicing the semiconductor elements is easily determined as the number of kinds of material of semiconductor elements close to one. In FIGS. 6A and 6B, the resin 4 and the lead frame 301 are required to be cut by the same steps. The resin 4 has a high content of silica filler about 70%, so that the resin 4 should be cut in a condition near the condition suitable for glass. In contrast, the lead frame 301 contains metal. Thus, when the resin 4 and the lead frame 301 are cut in the condition suitable for glass, the diamond blade used in the dicing may be clogged which easily results in failing of the cutting. For that reason, it is preferable that the dicing portion 302 of the lead frame 301 is narrowed as small as possible to reduce the cut amount of the metal as small as possible. For example, when the thickness of the lead frame 301 is 150 μm, the width of the frame portion 301 is set at for example 2 mm, and the width of the dicing portion 302 is set at for example 200 μm, thereby enabling the strength of the lead frame 301 to be enough, and the clogging during the dicing is suppressed. This provides an effective means for the laser cutting to reduce debris. In addition, the dicing portion 302 also functions as a individual marker of each cutting line in the dicing process, and the cutting positions can be corrected over the entire surface of the wafer, which enables a high precision cutting.

Note that, in the present embodiment, the dicing portion 302 of the lead frame 301 has a liner arrangement shape, but the dicing portion 302 may have other arrangement shape such as a zigzag shape. In this case, when the dicing is performed by using laser, the dicing can be easily performed along a non-linear line shape such as a zigzag.

As mentioned above, the cut surface (exposed surface) of the electrode lead 3 is required to be plated. For this reason, after the cutting process (division into individual pieces) is performed, all of the exposed portions of the electrode lead 3 are plated with Au/Ni by electroless plating.

In the cutting method shown in FIGS. 6A and 6B, the frame regions of the lead frame 301 are cut and discarded, which resulting in reduction of the number of acquirable modules. However, it is not necessarily a large loss by considering clogging of the diamond blade, throughput of regenerating (dressing) the clogged diamond blade, and cost of discarded portions of the lead frame 301 and resin 4. Rather, the optical semiconductor module of the present embodiment constituted by low cost materials has a greater contribution in reducing the cost.

The optical semiconductor module of the embodiment shown in FIG. 1A to FIG. 1E can be manufactured through the above mentioned processes. Noted that, each process condition and material to be applied may be appropriately selected, and the manufacturing method of the optical semiconductor module of the embodiment is not limited to the above mentioned manufacturing method.

Further more, in the present embodiment, the manufacturing method of the plurality of optical semiconductor modules is described, but a single optical semiconductor module may be manufactured.

(Third Embodiment)

Figure 7A:
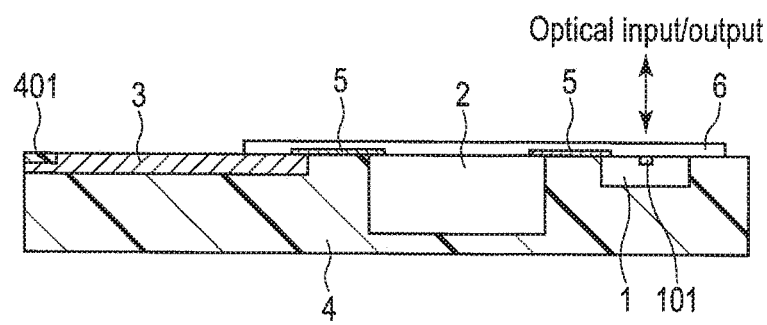
FIG. 7A is a schematic sectional view illustrating an optical semiconductor module according to an embodiment.
Figure 7B:
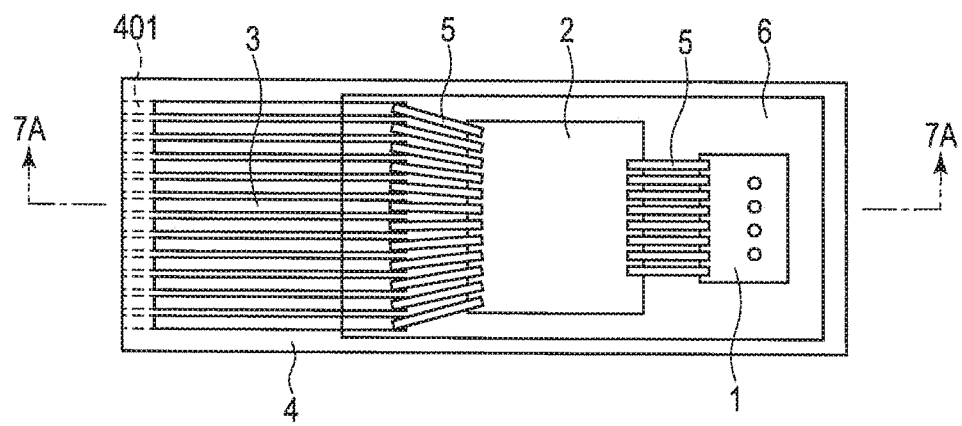
FIG. 7B is a schematic top view illustrating the optical semiconductor module according to the embodiment.

FIGS. 7A and 7B are schematic configuration diagrams illustrating an optical semiconductor module of the present embodiment, FIG. 7A is a sectional view, FIG. 7B is a top view. More particularly, FIG. 7A is the sectional view taken along a line 7A-7A in FIG. 7B.

In FIG. 7A, the reference symbol 401 denotes a resin filled in a half etching portion (concave portion) of an electrode lead 3. The half etching portion is not in contact with the temporary fixing layer 8 shown in FIGS. 2A and 2B.

The following is an exemplary method for obtaining the optical semiconductor module comprising the structure in which the half etching portion is filled with the resin 4 as shown in FIGS. 7A and 7B.

When the lead frame 301 is formed by processing the Cu plate, an additional pattern etching is applied to the Cu plate, thereby reducing the thickness of the half etching portion (corresponding to the resin 401) down to a half of the thickness of the electrode lead 3. At this time, a region including the periphery of the dicing portion 301 and the dicing portion 301 is defined as a half etching portion. After that, the above mentioned molding is performed. Subsequently, cutting of the wafer is performed, which corresponds to the cutting process in FIGS. 6A and 6B, thereby obtaining the optical semiconductor module comprising the structure in which the half etching portion is filled with the resin 401 as shown in FIGS. 7A and 7B. Consequently, a surface of electrode lead 3 corresponding to the half etching portion is not seen as view from above due to the resin 401.

As a result, in comparison with the case of the first embodiment in which the electrode lead 3 is exposed to the edge of the resin 4, the present embodiment enables suppression of hooking of the cut edge of the electrode lead 3 at the time of insertion of the connector, or a short-circuit of the edges of the electrode leads 3 caused by accumulation of metallic powder due to friction. In addition, the present embodiment further suppresses a mechanical damage such as a peeling of electrode lead 3 caused by the hooking of the edge of the electrode lead 3.

Further, a contact failure of the connector terminal, which is caused by erosion progression of the electrode lead 3, is not easily occurred even though the cut surface of the lead frame 301 (electrode lead 3) is not plated. Because the edge surfaces of the electrode lead 3 exposed by cutting the lead frame 301, are separated from the electrical connector terminal by the resin covered region 401. As a matter of course, even in the present embodiment, the edge surface of the electrode lead 3 may be plated. In addition, after cutting the lead frame 310, all of the exposed portions of the electrode leads 3, which are not covered with the resin 4, may be plated, instead of plating the lead frame 301 beforehand as described previously.

Note that, the embodiment of FIGS. 7A and 7B can be implemented not only by half etching of the lead frame 301 but also by denting a part of the lead portion toward the resin side by press work. When the denting is employed, the photolithography and the additional etching for the half etching portion of the lead frame 301 are not necessary.

In the present embodiment, the half etching portion has a liner arrangement shape, but the half etching portion having other arrangement shape such as a zigzag shape may be used. In this case, when the dicing is performed by using laser, the dicing can be easily performed along a non-linear line shape such as a zigzag.

(Fourth Embodiment)

Figure 8A:
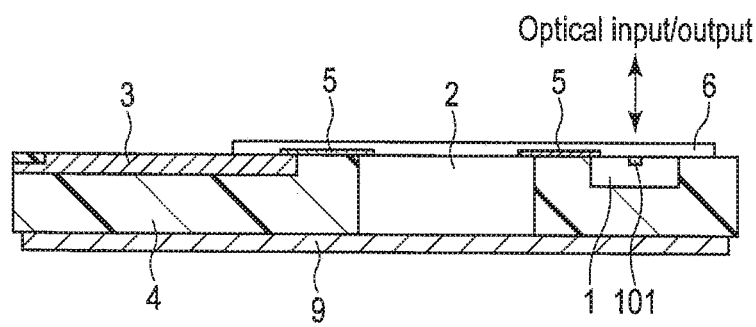
FIG. 8A is a schematic sectional view illustrating an optical semiconductor module according to an embodiment.
Figure 8B:
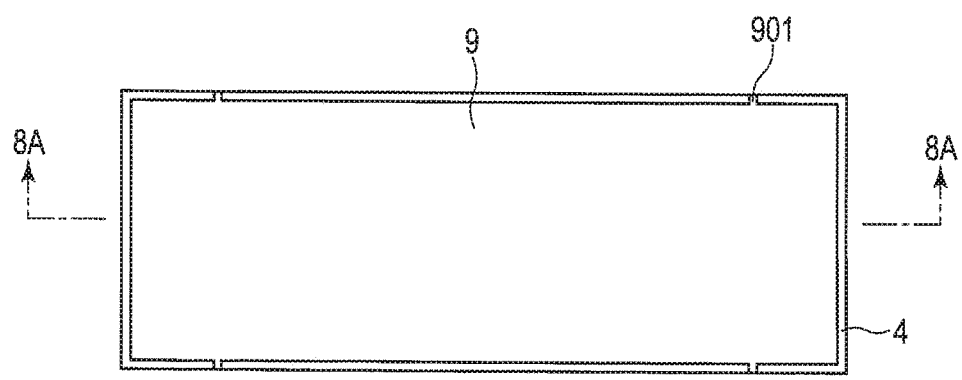
FIG. 8B is a schematic bottom view illustrating the optical semiconductor module according to the embodiment.

FIGS. 8A and 8B are schematic configuration diagrams illustrating an optical semiconductor module of the present embodiment, FIG. 8A is a sectional view, FIG. 8B is a bottom view. More particularly, FIG. 8A is the sectional view taken along a line 8A-8A in FIG. 8B.

In FIGS. BA and 8B, similarly to the first embodiment, the resin 4 holds the optical semiconductor element 1, the drive IC 2 and the electrode lead 3 which are arranged such that optical semiconductor element 1, the drive IC 2 and the electrode lead 3 are apart from each other. The optical semiconductor element 1, the drive IC 2 and the electrode lead 3 are configured to be embedded in the same side of the resin 4. That is, at this stage, the optical semiconductor element 1, the drive IC 2 and the electrode lead 3 are exposed from at least on the same side of the resin 4. Here, the drive IC 2 is further exposed from a rear surface opposite to the same side of the resin 4.

In FIGS. 8A and 8B, the reference symbol 9 denotes a rear heat sink, and the resin 4 is subjected to grinding until the rear surface of the drive IC 2 is exposed. The rear heat sink 9 is bonded on the rear surfaces of the resin 4 and the drive IC 2 by thermal conductive resin (for example, Ag paste, Cu paste or the like) using a lead frame. The lead frame is applied with slit processing which is performed such that the narrow bridging beams are remained in the dicing portion 901 as shown in FIG. 8B. After that, the dicing similarly to FIGS. 6A and 6B is performed, thereby enabling the formation of the optical semiconductor module of the present embodiment.

The drive IC 2 generates the most heat in the module. In the present embodiment, the rear heat sink 9 enables heat radiation of the drive IC 2 through the rear surface. In addition, the rear heat sink 9 secures a shield of the rear surface of the optical semiconductor module. The rear heat sink 9 functions as a reinforce plate reinforcing the strength of a plug terminal as the electrical connector, so that the rear heat sink 9 contributes to improvement of reliability of the optical semiconductor module.

(Fifth Embodiment)

FIG. 9 is a schematic sectional view illustrating an example of an optical semiconductor module of an embodiment coupled to an optical fiber, in which an imaging system is constituted by a concave mirror 1001, and a light path is changed to a vertical direction by the concave mirror 1001. FIG. 10 is an enlarged schematic sectional view illustrating an optical system of the optical semiconductor module in FIG. 9.

In FIGS. 9 and 10, the reference symbol 10 denotes an optical coupling member, the reference symbols 11 and 14 denote transparent adhesives, the reference symbol 12 denotes an optical fiber, the reference symbol 13 denotes a protective resin (jacket) for optical fiber, and in FIG. 9, the reference symbol 15 denotes a rubber boot.

The optical coupling member 10 is a molding product of transparent resin such as epoxy resin, silicone resin, acrylate resin, polycarbonate resin. The optical coupling member 10 comprises a mechanical alignment structure such as a fitting portion.

The optical semiconductor module is inserted into the optical coupling member 10 and butted against the optical coupling member 10, and bonded to the optical coupling member 10 through transparent adhesive 11.

The optical fiber 12 has a shaped end face. The optical fiber 12 and the jacket 13 are inserted into the optical coupling member 10 and the optical fiber 12 is butted against the optical coupling member 10 such that an active portion 101 of an optical semiconductor element 1 is optically coupled to the optical fiber 12 by a concave mirror 1001. The optical fiber 12 is inserted into the optical coupling member 10 from the shaped end face side. The optical fiber 12 and the jacket 13 are bonded to the optical coupling member 10 through transparent adhesive 14.

The rubber boot 15 prevents the optical fiber 12 from braking by an abrupt bending at an exit of the optical coupling member 10 for instance. Further, the rubber boot 15 functions as a knob for the insertion and extraction operation of the electrical connector terminal (plug portion including the electrode lead 3), which facilitates handling of the module as a connector.

The concave mirror 1001 serves as a total reflection mirror which changes a direction of light path to a vertical direction when the concave mirror 1001 is for example formed on a slope about 45° and the outside of the concave mirror 1001 is exposed to air. Thus, the concave mirror 1001 is configured as an optical imaging system between the optical semiconductor element 1 and an optical fiber core (not shown) by adjusting the curvature of a concave surface of the concave mirror 1001. In addition, when metal such as Au or Ag is deposited on the outside of the concave mirror 1001 by vacuum evaporation, the reflectivity of the concave mirror 1001 is stabilized, thereby enabling a prevention of light leak of the concave mirror 1001 caused by dew condensation generated by the exposure to the air.

The refraction between the optical semiconductor module and the optical coupling member 10 is matched by the transparent adhesive 11. However, it is assumed that an interface reflection is generated by a refractive index difference including temperature dependences of the transparent adhesive 11 and the optical coupling member 10. For this reason, a near-end reflection noise (operational instability depending on returning light phase) can be suppressed by obliquely forming an incident end surface of the optical coupling member 10 for example at 8° as shown in FIG. 10 when the optical semiconductor element is a semiconductor laser.

With this configuration, an active optical fiber cable for optical transmission can be easily constructed by preparing the optical coupling member 10, the optical fiber 12, the jacket 13, and the rubber boot 15 in addition to the optical semiconductor module of the embodiment, and assembling the optical coupling member 10, the optical fiber 12, the jacket 13, the rubber boot 15 and the optical semiconductor module by fitting using the transparent adhesives 11 and 14. More specifically, the optical semiconductor module, the optical fiber 12 and the jacket 13 are fitted into the optical coupling member 10, and bonded to the optical coupling member 10 by using adhesives 11 and 14, and then the optical semiconductor module, the optical fiber 12, the jacket 13 and the optical coupling member 10 are fitted into the rubber boot 15.

The optical coupling member 10 and the rubber boot 15 can be formed at low cost by using general resin molding, and the assembling can be performed without using a special machine as seen from the above, so that the configuration has an advantage in reducing cost for the optical transmission.

(Sixth Embodiment)

Figure 11:
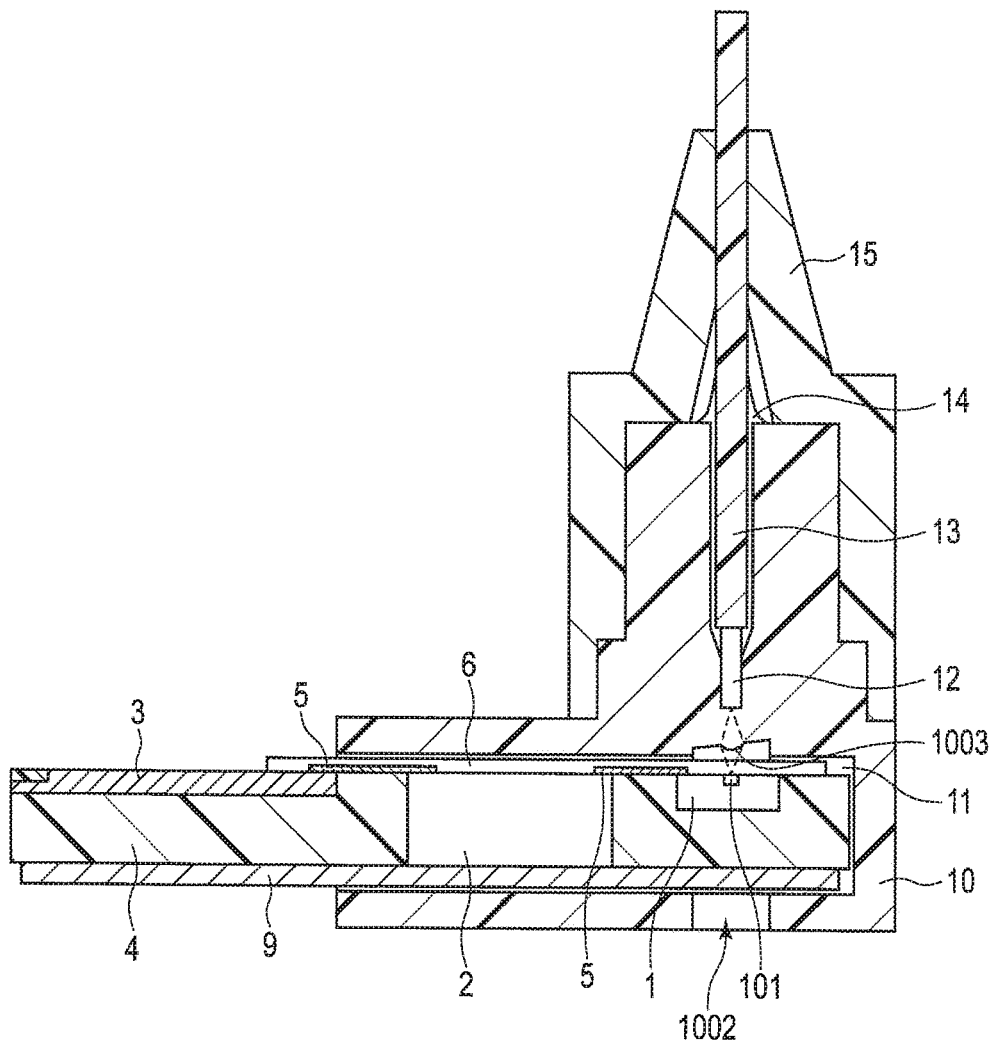
FIG. 11 is a schematic sectional view illustrating an example of an optical semiconductor module coupled to an optical fiber according to an embodiment.
Figure 12:
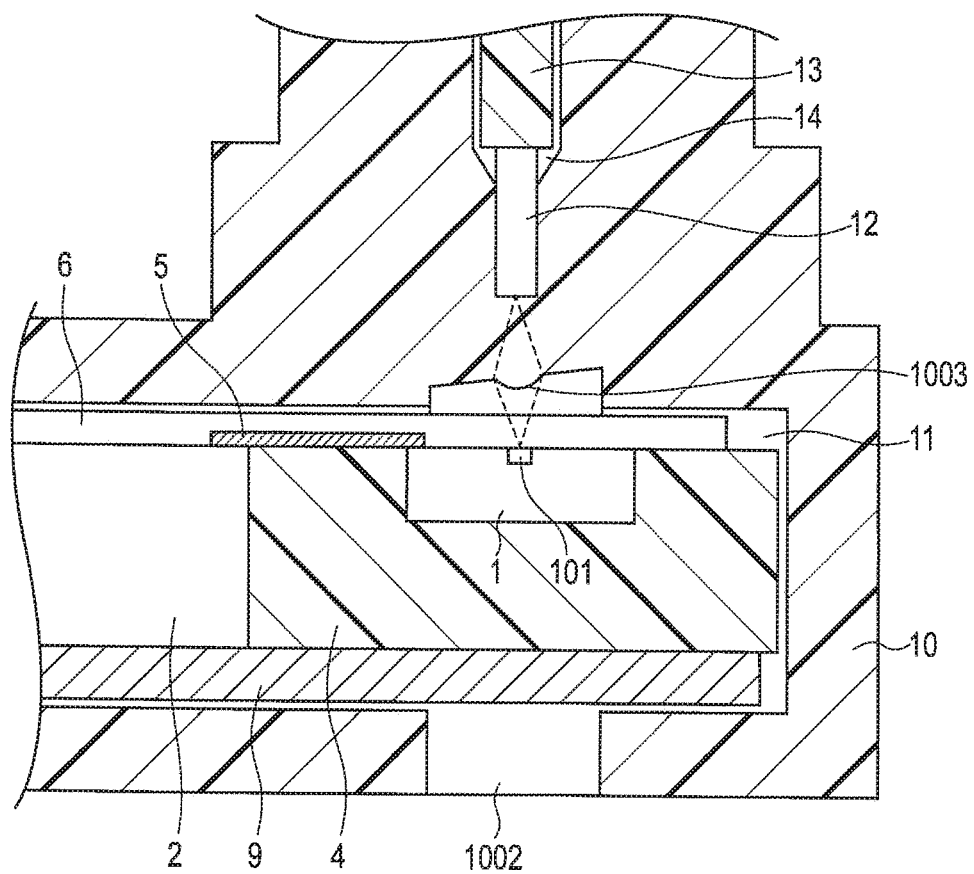
FIG. 12 is an enlarged schematic sectional view illustrating the optical semiconductor module according to the embodiment.

FIG. 11 is a schematic sectional view illustrating an example of an optical semiconductor module of an embodiment coupled to an optical fiber, in which an imaging system is constituted by a convex mirror 1003, and a light path is parallel to a vertical direction (orthogonal to the connector terminal) by the convex mirror 1003. FIG. 12 is an enlarged schematic sectional view illustrating an optical system of the optical semiconductor module in FIG. 11.

In the present embodiment, an optical fiber 12 is inserted into the optical coupling member 10 and butted against the optical coupling member 10 such that an active portion 101 of an optical semiconductor element 1 is optically coupled to the optical fiber 12 by a convex lens 1003. The optical coupling member 10 includes a mechanical alignment structure such as a fitting portion. The optical coupling member 10 further includes an inlet 1002 for injecting a transparent adhesive 11. The transparent adhesive 11 is injected into the optical coupling member 10 through the inlet 1002. The optical semiconductor module and the optical fiber 12 are fixed to the optical coupling member 10 by the transparent adhesive 11 injected from the inlet 1002.

In the present embodiment, the transparent adhesive 11 is injected into the optical coupling member 10 after the optical semiconductor module is set into the optical coupling member 10. The injected transparent adhesive 11 should not reach the convex lens 1003. The convex lens 1003 functions as an imaging lens as a result of refraction index difference between the convex lens 1003 and air. In order to preserve the refraction index difference, air gap is required between the optical semiconductor module of the embodiment and the convex lens 1003. For that reason, the convex portion of the optical coupling member 10 is provided with an uneven portion configured to cease the flow of the transparent adhesive 11.

As shown in FIG. 12, the convex lens 1003 is provided in an oblique surface at 8° of the optical coupling member 10 for instance. A central axis of the light emitted from the optical fiber 12 is slightly shifted from the optical input and/or output portion of the optical semiconductor element 1 by way of the convex lens 1003. Thereby suppressing the reflection noise (instability operation depending on phase of the returning light) when the optical semiconductor element is a semiconductor laser.

According to the present embodiment, the active optical fiber cable for optical transmission can be easily constructed, and the cost for the optical transmission is reduced similarly to the fifth embodiment.

(Seventh Embodiment)

Figure 13A:
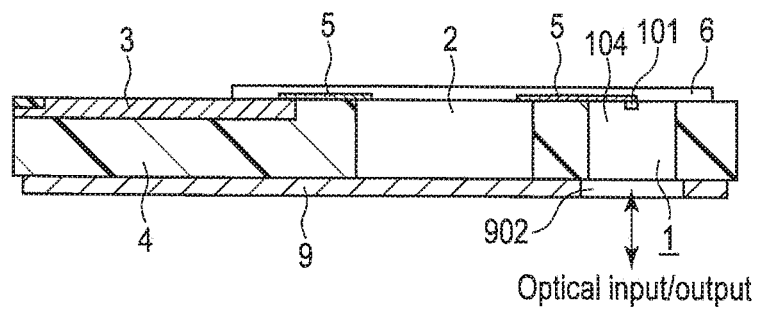
FIG. 13A is a schematic sectional view illustrating an optical semiconductor module according to an embodiment.
Figure 13B:
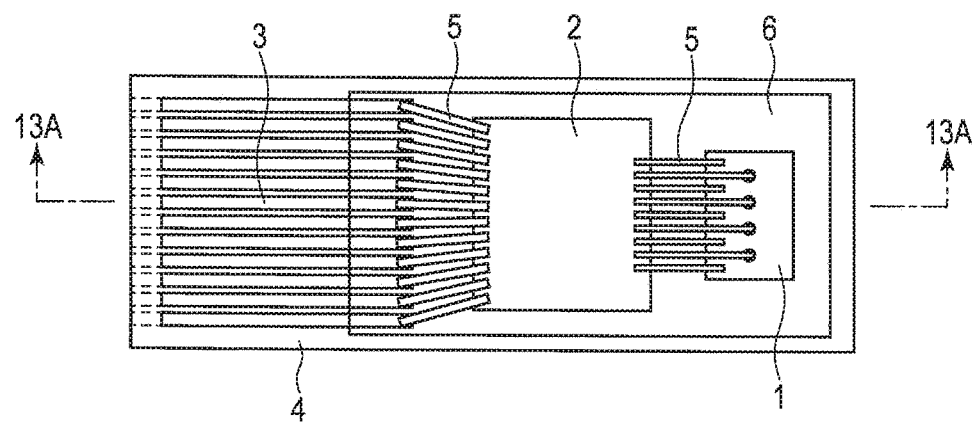
FIG. 13B is a schematic top view illustrating the optical semiconductor module according to the embodiment.
Figure 13C:
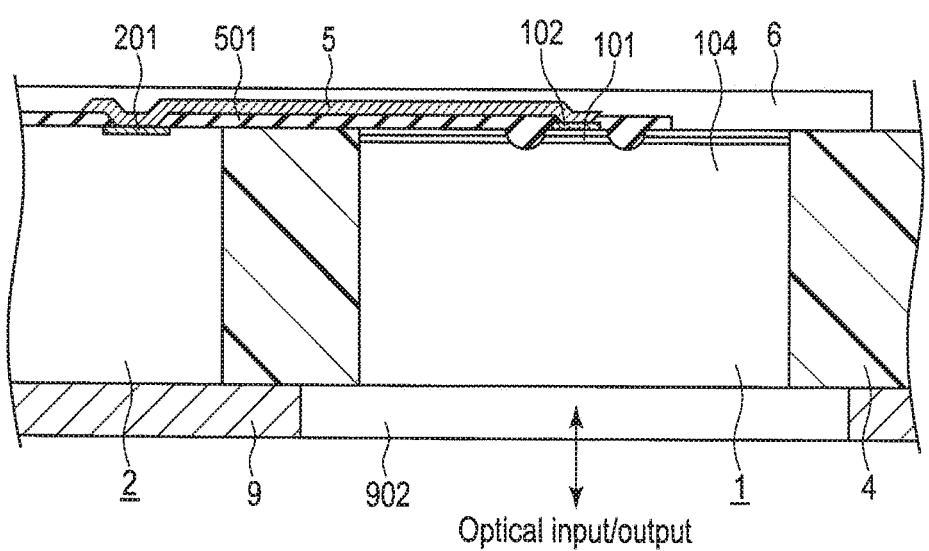
FIG. 13C is an enlarged schematic sectional view illustrating the optical semiconductor module according to the embodiment.

FIGS. 13A to 13C are schematic configuration diagrams illustrating an optical semiconductor module of the present embodiment, FIG. 13A is a sectional view, FIG. 13B is a top view, FIG. 13C is an enlarged sectional view. More particularly, FIGS. 13A and 13C are the sectional view taken along a line 13A-13A in FIG. 13B.

In FIGS. 13A to 13C, an optical semiconductor element 1 is formed on a transparent substrate 104. The transparent substrate 104 permits passage of light that has an operating wavelength of the optical semiconductor element 1. For example, when the operating wavelength is 1.3 µm, an active layer 101 of GaInAs or the like is formed on an InP substrate as the transparent substrate 104 by crystal growth. In addition, the transparent substrate (InP substrate) 104 is exposed on a side of the rear surface of the resin 4, and the optical input and/or output is performed on a side opposite to the interconnect layer 5.

In FIGS. 13A and 13C, the reference symbol 902 denotes an opening portion of a rear heat sink 9 which is provided so as not to disturb at least the optical input and/or output. In some cases, the rear heat sink 9 is provided without being in contact with the optical semiconductor element 1 to suppress a thermal interference with the drive IC 2. That is, By comparing with the structure comprising the optical semiconductor element 1 and the drive IC 2 which are connected by the rear heat sink 9, the structure comprising the optical semiconductor element 1 and the drive IC 2 which are not connected by the rear heat sink 9 effectively suppresses the reduction of characteristic and the degradation of element caused by thermal interference, when the drive IC 2 sufficiently generates heat and the optical semiconductor element 1 sufficiently releases heat. Moreover, in the present embodiment, the resin 6 may not be an opaque, and material of the resin 6 may be selected from the point of view of gas barrier property, heat resistance property or the like.

With this configuration, the electrical interconnect layer 5, and the optical input and/or output portion are separated, thereby enabling the optical characteristic and the electricity characteristic of the module to be individually optimized.

The optical semiconductor element 1 shown in FIG. 1D requires securing not only an area for an optical input and/or output portion of the active portion 101, but also an area for electrically connecting the electrodes 102 to the active portion 101, thus the active portion 101 may have a large area.

For example, in FIG. 1D, when the area (circular shape) for the optical input and/or output portion is defined by 50 µm diameter, and the area for electrically connecting the electrodes 102 (ring shape with 10 µm width) to the active portion 101, a p-n junction area of the active portion 101 is defined by 70 µm diameter at minimum, and practically 80 µm diameter.

In contrast, relating to the rear optical input and/or output type optical semiconductor element 1 of the present embodiment shown in FIG. 13C, when the area for the optical input and/or output portion of the active portion 101 is defined by for example 50 μm diameter, and the area for electrically connecting the electrodes 102 to the active portion 101 is defined by 50 μm diameter, and the area of the p-n junction of the active portion 101 is defined 60 μm diameter or less. Thus, compared with the optical semiconductor element 1 in FIG. 1D, the optical semiconductor 1 element in FIG. 13 can reduce parasitic capacitance and parasitic resistance respectively by 44% and 5%, and a basic frequency characteristic by parasitic inductance can be improved by 87%.

In this way, by employing the optical input and/or output performed on the rear side, and separating the electrical interconnect layer 5 from the optical input and/or output system, thereby enabling improvement of the characteristics of the optical semiconductor module and reduction of the cost per operating frequency.

(Eighth Embodiment)

Figure 14A:
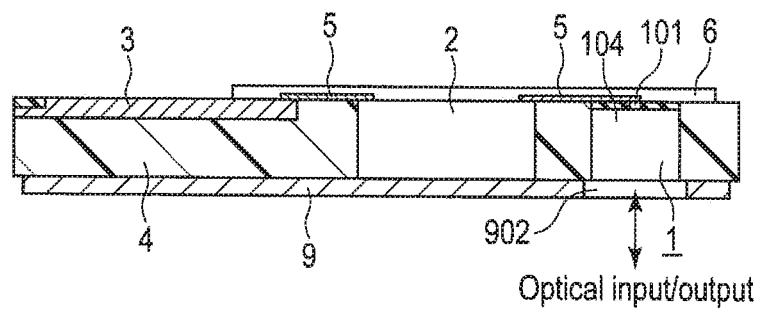
FIG. 14A is a schematic sectional view illustrating an optical semiconductor module according to an embodiment.
Figure 14B:
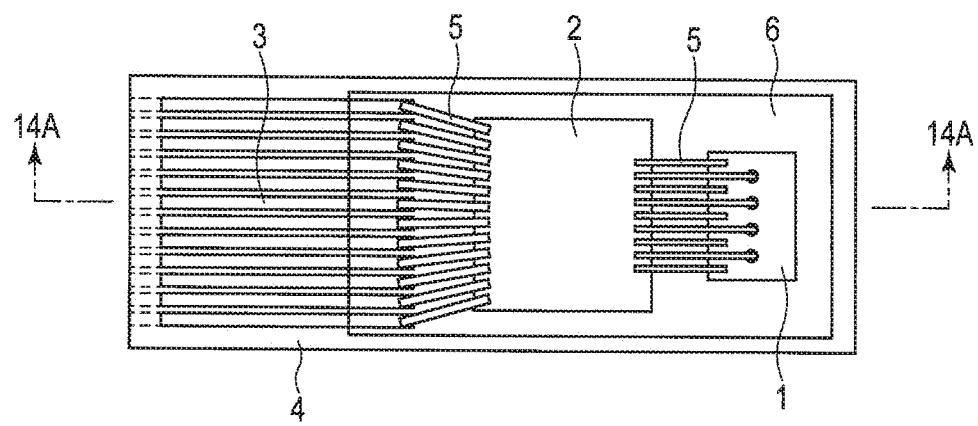
FIG. 14B is a schematic top view illustrating the optical semiconductor module according to the embodiment.
Figure 14C:
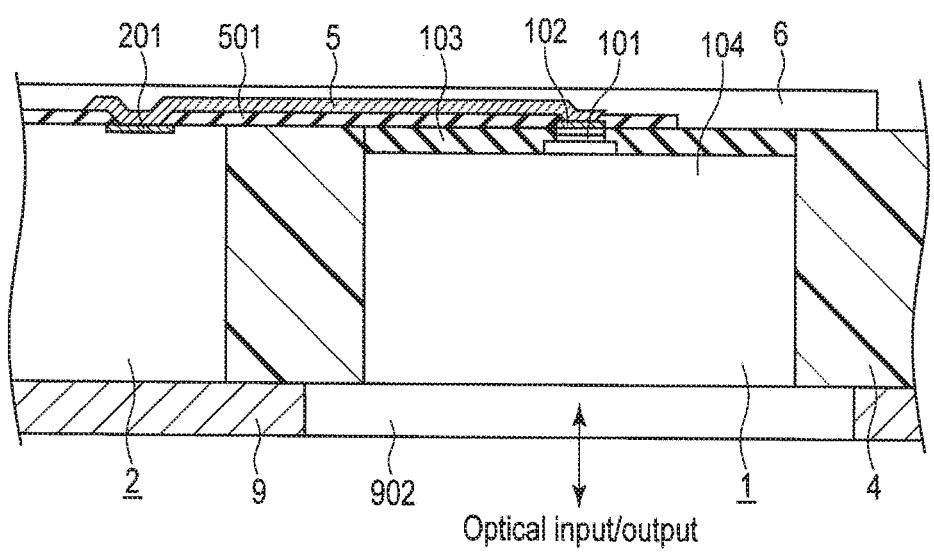
FIG. 14C is an enlarged schematic sectional view illustrating the optical semiconductor module according to the embodiment.

FIGS. 14A to 14C are schematic configuration diagrams illustrating an optical semiconductor module of the present embodiment, FIG. 14A is a sectional view, FIG. 14B is a top view, FIG. 14C is an enlarged sectional view. More particularly, FIGS. 14A and 14C are the sectional view taken along a line 14A-14A in FIG. 14B.

In FIG. 14C, the reference symbol 104 denotes a silicon (Si) substrate, and an optical semiconductor element 1 containing a compound semiconductor material is provided on the silicon substrate 104. The compound semiconductor material constitutes, for example, the active portion (compound semiconductor layer) 101. The compound semiconductor material on the silicon substrate 104 can be formed by crystal growth of compound semiconductor material onto the silicon substrate 104 or bonding of semiconductor material. When the operating wavelength is greater than 1.3 μm, the silicon substrate 104 becomes a transparent substrate, thereby obtaining the similar effect as the seventh embodiment.

In addition to the above effect, the present embodiment provides an effect of suppressing contamination caused by intrusion of the compound semiconductor material into a manufacturing line. Because a rear surface of the Si substrate 104 is exposed as a rear surface of the semiconductor element 1 after grinding the resin 4. Further, the drive IC 2 is generally formed in a Si substrate. When drive IC 2 is formed in the Si substrate, a rear surface of the Si substrate is exposed as a rear surface of the drive IC 2 after grinding the resin 4, thus the drive IC 2 does not cause the contamination, either In the seventh embodiment, the Si substrate, the resin and the compound semiconductor substrate are required to be thinned at the same time during the process for exposing the rear surface of the optical semiconductor element 1. The material of the compound semiconductor such as InP or GaAs is generally more fragile than Si, which may cause damage of the compound semiconductor substrate. In contrast, in the present embodiment, the Si substrate is used instead of the compound semiconductor substrate, thus the substrate damage is prevented.

The compound semiconductor is expensive material. When the compound semiconductor is selectively adhered on the area needed for forming the optical device, the utilization efficiency of the compound semiconductor is improved, thereby easily reducing the cost of the compound semiconductor.

(Ninth Embodiment)

Figure 15:
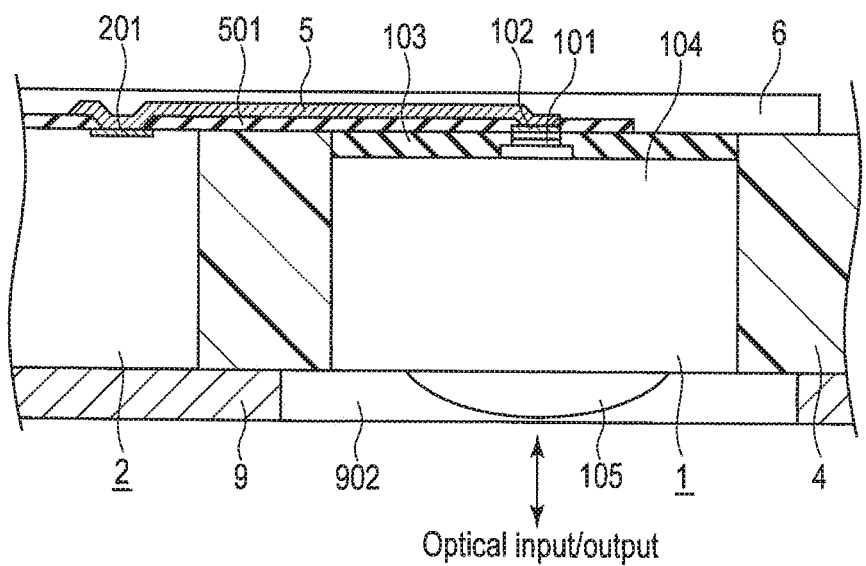
FIG. 15 is an enlarged schematic sectional view illustrating an optical semiconductor module according to an embodiment.

FIG. 15 is a schematic configuration diagram illustrating an optical semiconductor module of the present embodiment, and is an enlarged sectional view same as FIG. 14C.

In FIG. 15, the reference symbol 105 denotes a convex lens (optical element) 105 which is provided on the rear surface of the transparent substrate 104. The convex lens is obtained by, for example, forming a transparent resin into a hemispherical shape on the rear surface of the silicon substrate 104.

The seventh and eighth embodiments employ the optical input and/or output performed on the rear side, thereby enabling characteristics such as high frequency characteristic to be improved. However, light beam may be spread because a distance from the active portion 101 to the optical input and/or output portion of the rear surface of the substrate increases.

In the present embodiment, the spread of the light beam is compensated by the convex lens 105 provided on the rear surface of the transparent substrate 104. Other lens such as a diffraction lens or a Fresnel lens may be used instead of the convex lens 105, which also provides same effect as the convex lens 105. Moreover, the direction of inputted or outputted light can be controlled by using a diffracting grating (optical element) instead of the lenses.

Therefore, the optical semiconductor module comprising the optical element of the present embodiment enables increasing of the optical coupling efficiency with the optical fiber, or controlling of the direction of the inputted or outputted light or the like.

(Tenth Embodiment)

Figure 16A:
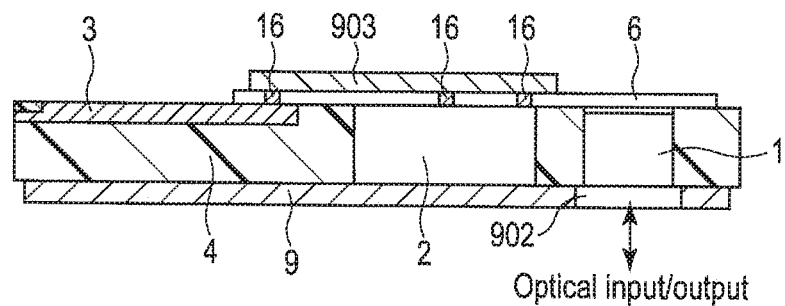
FIG. 16A is a schematic sectional view illustrating an optical semiconductor module according to an embodiment.
Figure 16B:
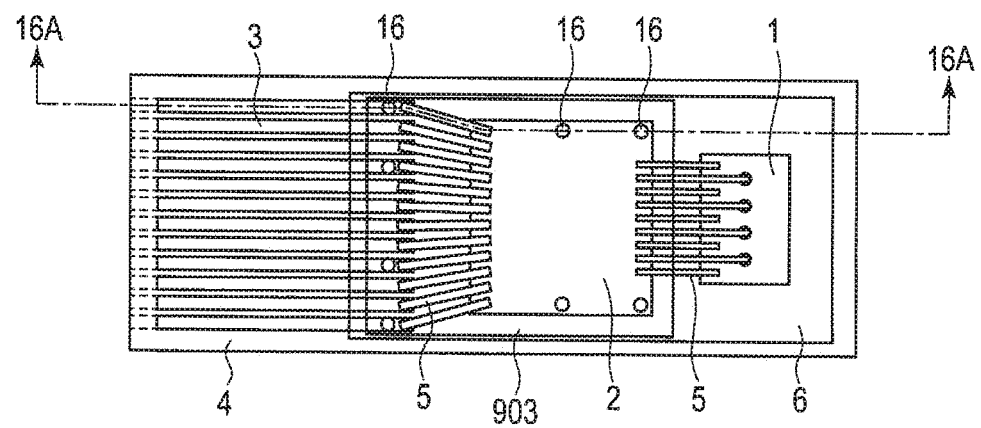
FIG. 16B is a schematic top view illustrating the optical semiconductor module according to the embodiment.

FIGS. 16A and 16B are schematic configuration diagrams illustrating an optical semiconductor module of the present embodiment, FIG. 16A is a sectional view, FIG. 16B is a top view. More particularly, FIG. 16A is the sectional view taken along a line 16A-16A in FIG. 16B.

In FIGS. 16A and 16B, the reference symbol 16 denotes Cu pillar as a thermal via, and the reference symbol 903 denotes surface heat sink. The surface heat sink 903 is connected to the drive IC 2 and the electrode lead 3 via a plurality of Cu pillars 16 which penetrate through the transparent resin 6. The lower surfaces of the plurality of the Cu pillars 16 are in contact with, for example, a part of the drive IC 2 or the electrode lead 3, which constitutes a ground.

According to the present embodiment, the heat of the drive IC 2 and the electrode lead 3 is released from the surface heat sink 903 to an outside via the Cu pillars 16. Further, the surface heat sink 903 may be used as a shield. Moreover, in addition to the surface heat sink 903, the rear surface heat sink 9 shown in FIGS. 8A and 8B may be further provided.

Note that, in the above mentioned embodiment (the method of manufacturing the optical semiconductor module), the width of the dicing portion 302 is smaller than the width of the lead frame 301, however, the width of the dicing portion 302 may be same as the width of the lead frame 301.

Further, in the above mentioned embodiment, the optical semiconductor module including the optical semiconductor element is explained, however, other type of semiconductor module which includes a semiconductor element other than the optical semiconductor element may be implemented in accordance with the optical semiconductor module.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical semiconductor module comprising:
an optical semiconductor element;
an electrode lead placed on substantially the same plane as the optical semiconductor element, and the electrode lead arranged apart from the optical semiconductor element;
a resin holding the optical semiconductor element and the electrode lead; and
an interconnect layer for electrically or functionally connecting the optical semiconductor element and the electrode lead,
wherein the optical semiconductor element and the electrode lead are embedded in the same surface side of the resin, and a part of the interconnect layer is directly provided on the resin or provided on the resin via an insulating layer.

2. The module of claim 1, further comprising a drive circuit chip for driving the optical semiconductor element,
wherein the drive circuit chip is arranged apart from the optical semiconductor element and the electrode lead, and embedded in the same surface side of the resin, and
wherein the interconnect layer comprises a first interconnect layer for connecting the optical semiconductor element and the drive circuit chip, and a second interconnect layer for connecting the drive circuit chip and the electrode lead.

3. The module of claim 1, wherein the optical semiconductor element includes at least one of a light emitting element or a light receiving element.

4. The module of claim 1, wherein the optical semiconductor element includes at least one of an array of light emitting elements or an array of light receiving elements.

5. The module of claim 1, wherein the optical semiconductor element comprises a silicon substrate, and a compound semiconductor layer provided on the silicon substrate.

6. The module of claim 1, wherein the insulating layer includes a buffer insulating layer.

7. The module of claim 1, further comprising a heat sink.

8. The module of claim 1, wherein the electrode lead is configured as a terminal of an electrical connector to connect the optical semiconductor element to an external.

9. The module of claim 1, wherein a light emitting portion or a light receiving portion of the optical semiconductor element is provided on a side to which the interconnect layer is provided.

10. The module of claim 9, further comprising a transparent resin provided on the light emitting portion or the light receiving portion of the optical semiconductor element.

11. The module of claim 1, wherein the optical semiconductor element comprises a transparent substrate, and a light emitting portion or a light receiving portion provided on the transparent substrate, and a rear surface of the transparent substrate is exposed on a side opposite to the side on which the interconnect layer is provided.

12. The module of claim 11, further comprising an optical element provided on the rear surface of the transparent substrate.

13. The module of claim 12, wherein the optical element includes a lens or a diffraction grating.

14. An optical semiconductor module manufacturing method comprising:
arranging a lead frame on an adhesive member, the lead frame comprising at least one conductive lead;
arranging at least one optical semiconductor element on the adhesive member by using the lead frame as a coordinate reference such that the at least one optical semiconductor element is not in contact with the lead frame;
integrating the lead frame and the at least one optical semiconductor element with a resin;
removing the adhesive member from the lead frame, the at least one optical semiconductor element and the resin; and
forming at least one interconnect layer on a region exposed by removing the adhesive member such that the at least one interconnect layer electrically or functionally connects the at least one optical semiconductor element and the at least one conductive lead,
wherein:
the at least one conductive lead includes N (=integer 2 or more) numbers of conductive leads,
the at least one optical semiconductor element includes the N numbers of optical semiconductor elements,
the at least one interconnect layer includes the N numbers of interconnect layers, and
the N numbers of the conductive leads electrically or functionally connect the N numbers of the optical semiconductor elements and the N numbers of the conductive leads, respectively.

15. The method of claim 14, wherein the lead frame further comprises the N numbers of first regions and the N numbers of second regions, the N numbers of the first regions each having a first width, and the N numbers of the second regions each having a second width narrower than the first width.

16. The method of claim 15, further comprising cutting the N numbers of the second regions.

17. The method of claim 15, further comprising the N numbers of non-metallic members, wherein the N numbers of the non-metallic members are respectively embedded in the N numbers of the conductive leads and not in contact with the adhesive layer.

18. The method of claim 17, further comprising cutting the N numbers of the non-metallic members.

* * * * *